US010170188B1

(12) United States Patent
Yip

(10) Patent No.: US 10,170,188 B1
(45) Date of Patent: Jan. 1, 2019

(54) 3D MEMORY DEVICE INCLUDING SHARED SELECT GATE CONNECTIONS BETWEEN MEMORY BLOCKS

(71) Applicant: Micron Technology, Inc., Boise, ID (US)

(72) Inventor: Aaron Yip, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/693,118

(22) Filed: Aug. 31, 2017

(51) Int. Cl.
| | | |
|---|---|---|
| G11C 16/04 | (2006.01) | |
| H01L 27/11524 | (2017.01) | |
| H01L 27/1157 | (2017.01) | |
| H01L 27/11556 | (2017.01) | |
| H01L 27/11582 | (2017.01) | |
| G11C 16/26 | (2006.01) | |
| G11C 16/14 | (2006.01) | |
| G11C 16/08 | (2006.01) | |

(52) U.S. Cl.
CPC ...... *G11C 16/0483* (2013.01); *H01L 27/1157* (2013.01); *H01L 27/11524* (2013.01); *H01L 27/11556* (2013.01); *H01L 27/11582* (2013.01); *G11C 16/08* (2013.01); *G11C 16/14* (2013.01); *G11C 16/26* (2013.01)

(58) Field of Classification Search
CPC ........... H01L 27/11578; H01L 27/1158; H01L 27/11582

USPC ..................................... 365/185.11; 257/316
See application file for complete search history.

(56) References Cited

U.S. PATENT DOCUMENTS

| | | | | |
|---|---|---|---|---|
| 7,852,676 | B2* | 12/2010 | Maejima | G11C 5/02 365/185.11 |
| 8,542,533 | B2* | 9/2013 | Maejima | G11C 16/0483 365/185.17 |
| 8,964,474 | B2* | 2/2015 | Morooka | G11C 16/06 365/185.17 |
| 9,183,943 | B2* | 11/2015 | Ahn | G11C 16/3422 |
| 9,620,219 | B2* | 4/2017 | Kim | G11C 16/10 |
| 9,679,650 | B1* | 6/2017 | Sakui | G11C 16/08 |
| 9,853,047 | B2* | 12/2017 | Choi | H01L 27/11582 |

\* cited by examiner

*Primary Examiner* — Son Mai
(74) *Attorney, Agent, or Firm* — Schwegman Lundberg & Woessner, P.A.

(57) ABSTRACT

Some embodiments include apparatuses, and methods of operating the apparatuses. Some of the apparatuses include a data line, a first memory cell string including first memory cells located in different levels of the apparatus, first access lines to access the first memory cells, a first select gate coupled between the data line and the first memory cell string, a first select line to control the first select gate, a second memory cell string including second memory cells located in different levels of the apparatus, second access lines to access the second memory cells, the second access lines being electrically separated from the first access lines, a second select gate coupled between the data line and the second memory cell string, a second select line to control the second select gate, and the first select line being in electrical contact with the second select line.

14 Claims, 11 Drawing Sheets

3D MEMORY DEVICE INCLUDING SHARED SELECT GATE CONNECTIONS BETWEEN MEMORY BLOCKS

BACKGROUND

Memory devices are widely used in computers, cellular phones, and many other electronic items. A conventional memory device, such as a three-dimensional (3D) NAND flash memory device, has many memory cells to store information. The memory cells are often organized into blocks. A memory device has circuitry to provide signals to selection components associated with the blocks. The selection components can select memory cells from a portion of a block among the blocks in order to store information in or read information from the selected memory cells. The memory device also has circuitry to provide such signals to the selection components. In structures of some conventional memory devices, such circuitry may occupy a relatively large area in the memory device. Such a large area may impose area limitation in such conventional memory devices.

DETAILED DESCRIPTION

Figure 1:
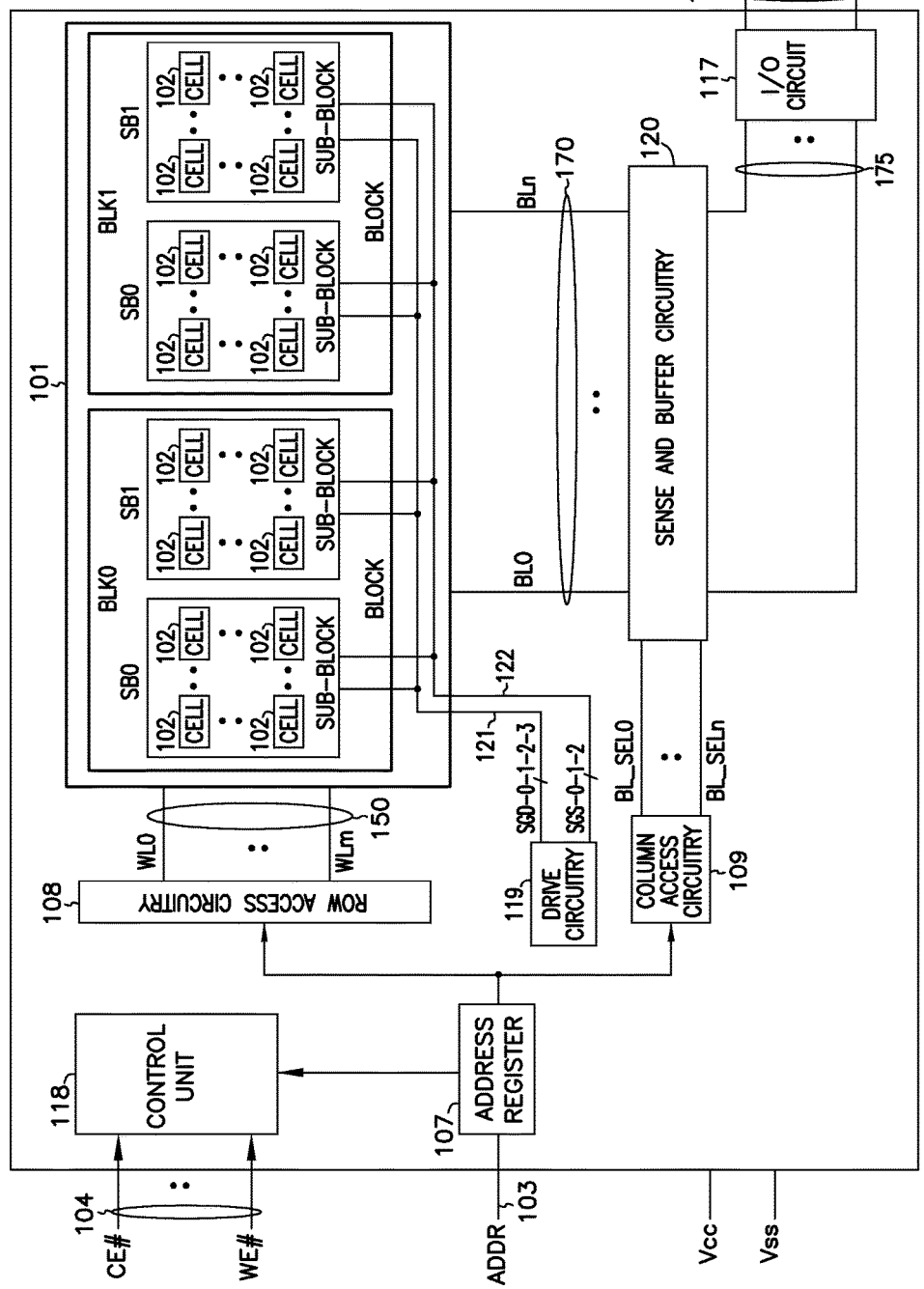
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array (or multiple memory arrays) 101 containing memory cells 102 arranged in blocks (blocks of memory cells), such as blocks BLK0 and BLK1. Each of blocks BLK0 and BLK1 can include its own sub-blocks, such as sub-blocks SB0 and SB1. In the physical structure of memory device 100, memory cells 102 can be arranged vertically (e.g., stacked over each other) over a substrate (e.g., a semiconductor substrate) of memory device 100. FIG. 1 shows memory device 100 having two blocks BLK0 and BLK1 and two sub-blocks in each of the blocks as an example. Memory device 100 can have more than two blocks and more than two sub-blocks in each of the blocks.

As shown in FIG. 1, memory device 100 can include access lines (which can include word lines) 150 and data lines (which can include bit lines) 170. Access lines 150 can carry signals (e.g., word line signals) WL0 through WLm. Data lines 170 can carry signals (e.g., bit line signals) BL0 through BLn. Memory device 100 can use access lines 150 to selectively access memory cells 102 of blocks BLK0 and BLK1 and data lines 170 to selectively exchange information (e.g., data) with memory cells 102 of blocks BLK0 and BLK1. Blocks BLK0 can have access lines (e.g., word lines) that are electrically separated from access lines (e.g., word lines) of block BLK1. Sub-blocks of the same block can share access lines (e.g., can share word lines). For example, sub-blocks SB0 and SB1 of block BLK0 can share a group of access line, and sub-blocks SB0 and SB1 of block BLK1 can share another group of access lines.

Memory device 100 can include an address register 107 to receive address information (e.g., address signals) ADDR on lines (e.g., address lines) 103. Memory device 100 can include row access circuitry 108 and column access circuitry 109 that can decode address information from address register 107. Based on decoded address information, memory device 100 can determine which memory cells 102 of which sub-blocks of blocks BLK0 and BLK1 are to be accessed during a memory operation. Memory device 100 can perform a read operation to read (e.g., sense) information (e.g., previously stored information) from memory cells 102 of blocks BLK0 and BLK1, or a write (e.g., programming) operation to store (e.g., program) information in memory cells 102 of blocks BLK0 and BLK1. Memory device 100 can use data lines 170 associated with signals BL0 through BLn to provide information to be stored in memory cells 102 or obtain information read (e.g., sensed) from memory cells 102. Memory device 100 can also perform an erase operation to erase information from some or all of memory cells 102 of blocks BLK0 and BLK1.

Memory device 100 can include a control unit 118 that can be configured to control memory operations of memory device 100 based on control signals on lines 104. Examples of the control signals on lines 104 include one or more clock signals and other signals (e.g., a chip enable signal CE#, a write enable signal WE#) to indicate which operation (e.g., read, write, or erase operation) memory device 100 can perform.

Memory device 100 can include drive circuitry 119 to provide signals (e.g., drain select gate signals) SGD-0-1-2-3 (short for SGD0, SGD1, SGD2, and SGD3) on lines (conductive lines) 121, and signals (e.g., source select gate signals) SGS-0-1-2 (short for SGS0, SGS1, and SGS2) on lines (conductive lines) 122 to blocks BLK0 and BLK1. FIG. 1 shows four signals SGD-0-1-2-3 and three signals SGS-0-1-2 as an example. The number of these signals can vary.

Signals SGD-0-1-2-3 can be provided with different voltages or the same voltage in the same operation at a particular time, depending on which operation memory device 100 operates at that particular time. Signals SGD-0-1-2-3 can also be provided with different voltages or the same voltages between different operations.

Signals SGS-0-1-2 can be provided with different voltages or the same voltage in the same operation at a particular time, depending on which operation memory device 100 operates at that particular time. Signals SGS-0-1-2 can also be provided with different voltages or the same voltages between different operations.

During an operation (e.g., read, write, and erase], memory device 100 can use signals SGD-0-1-2-3 and SGS-0-1-2 to selectively form a conductive path (e.g., a current path) between one of data line 170 and a sub-block (a selected sub-block) of either block BL0 or block BLK1. The values of information to be stored in or read from the selected sub-block can be based on the values (e.g., current or voltage values) of signals BL0 through BLn on data lines 170.

In the physical structure of memory device 100, drive circuitry 119 can be formed in the substrate (e.g., formed directly under or laterally under memory array 101). Alternative, drive circuitry 119 can be formed above the substrate.

Memory device 100 can include sense and buffer circuitry 120 that can include components such as sense amplifiers and page buffer circuits (e.g., data latches). Sense and buffer circuitry 120 can respond to signals BL_SEL0 through BL_SELn from column access circuitry 109. Sense and buffer circuitry 120 can be configured to determine (e.g., by sensing) the value of information read from memory cells 102 (e.g., during a read operation) of blocks BLK0 and BLK1 and provide the value of the information to lines (e.g., global data lines) 175. Sense and buffer circuitry 120 can also be configured to use signals on lines 175 to determine the value of information to be stored (e.g., programmed) in memory cells 102 of blocks BLK0 and BLK1 (e.g., during a write operation) based on the values (e.g., voltage values) of signals on lines 175 (e.g., during a write operation).

Memory device 100 can include input/output (I/O) circuitry 117 to exchange information between memory cells 102 of blocks BLK0 and BLK1 and lines (e.g., I/O lines) 105. Signals DQO through DQN on lines 105 can represent information read from or stored in memory cells 102 of blocks BLK0 and BLK1. Lines 105 can include nodes within memory device 100 or pins (or solder balls) on a package where memory device 100 can reside. Other devices external to memory device 100 (e.g., a memory controller or a processor) can communicate with memory device 100 through lines 103, 104, and 105.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or alternating current to direct current (AC-DC) converter circuitry.

Each of memory cells 102 can be programmed to store information representing a value of at most one bit (e.g., a single bit), or a value of multiple bits such as two, three, four, or another number of bits. For example, each of memory cells 102 can be programmed to store information representing a binary value "0" or "1" of a single bit. The single bit per cell is sometimes called a single-level cell. In another example, each of memory cells 102 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 102 can include non-volatile memory cells, such that memory cells 102 can retain information stored thereon when power (e.g., voltage Vcc, Vss, or both) is disconnected from memory device 100. For example, memory device 100 can be a flash memory device, such as a NAND flash (e.g., 3D NAND) or a NOR flash memory device, or another kind of memory device, such as a variable resistance memory device (e.g., a phase change memory device or a resistive Random Access Memory (RAM) device).

One of ordinary skill in the art may recognize that memory device 100 may include other components, several of which are not shown in FIG. 1 so as not to obscure the example embodiments described herein. At least a portion of memory device 100 can include structures and perform operations similar to or identical to the structures and operations of any of the memory devices described below with reference to FIG. 2 through FIG. 12.

Figure 2:
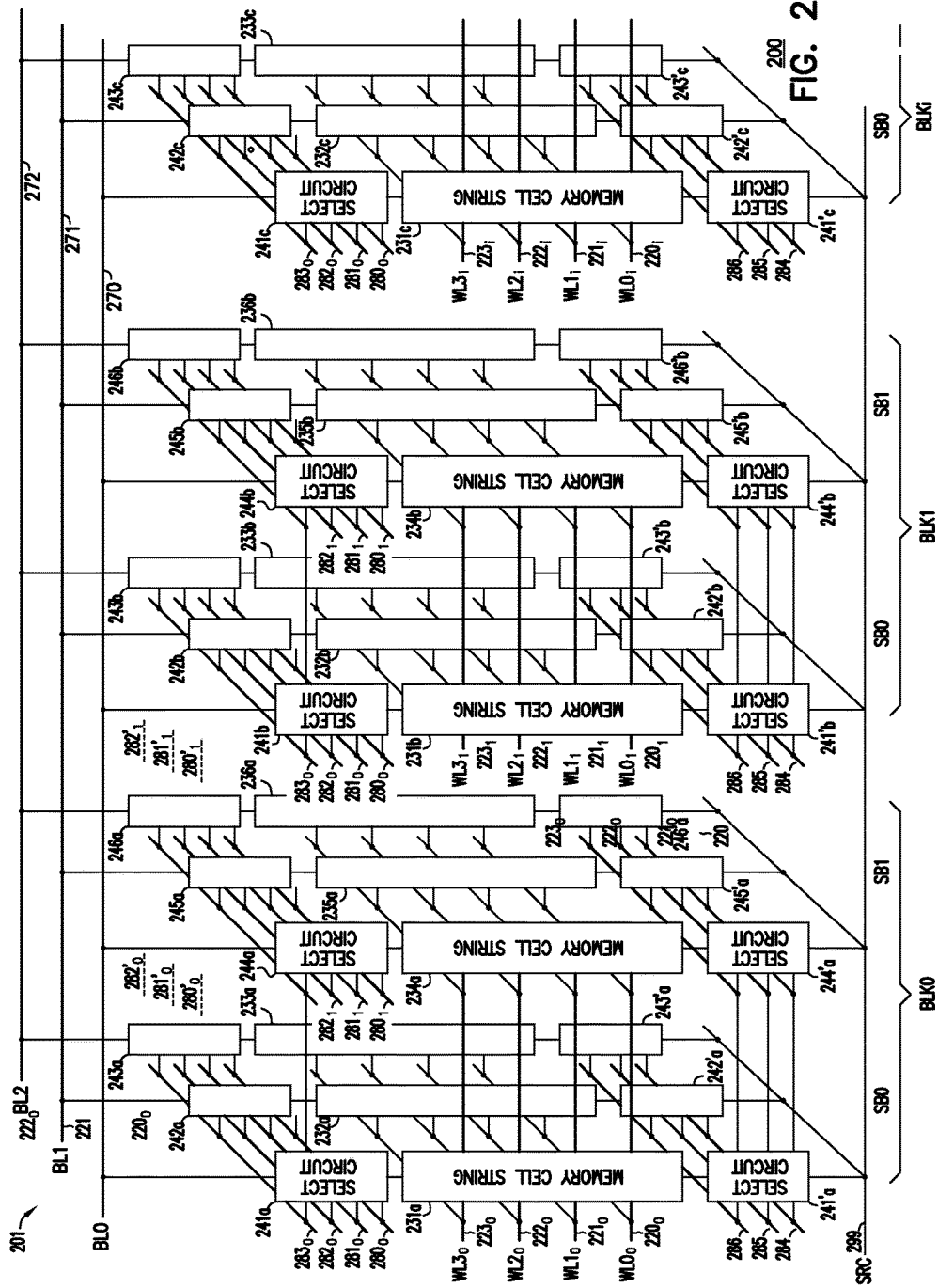
FIG. 2 shows a block diagram of a portion of a memory device including a memory array having memory cell strings and associated select circuits and select lines, according to some embodiments described herein.

FIG. 2 shows a block diagram of a portion of a memory device 200 including a memory array 201 having memory cell strings and associated select circuits, according to some embodiments described herein. Memory device 200 can correspond to memory device 100 of FIG. 1. For example, memory array 201 can form part of memory array 101 of FIG. 1.

As shown in FIG. 2, memory device 200 can include blocks (blocks of memory cells) BLK0, BLK1 through BLKi. Three blocks are shown as an example. Memory device 200 can include many blocks (e.g., up to thousands or more blocks). In the physical structure of memory device 200, the blocks can be arranged (e.g., formed) one block next to another block, such that each block can have a neighboring block. Neighboring blocks are blocks located immediately (e.g., adjacent) next to each other. For in example, in the physical structure of memory device 200, blocks BLK0 and BLK1 can be neighboring blocks.

Each of blocks BLK0, BLK1 through BLKi of memory device 200 can include (e.g., can be divided into) sub-blocks. For example, each of blocks BLK0 and BLK1 can include sub-blocks SB0 and SB1. Block BLKi can include a sub-block SB0 (and a sub-block SB1, which is not shown). Blocks BLK0, BLK1 through BLKi can include the same number of sub-blocks. FIG. 2 shows an example where each of blocks BLK0, BLK1 through BLKi can include two sub-blocks (e.g., SB0 and SB1). However, each of blocks BLK0, BLK1 through BLKi can have more than two blocks (e.g., SB0, SB1, SB2, SB3, and so on).

As shown in FIG. 2, each sub-block (e.g., SB0 or SB1) has its own memory cell strings, and each of the memory cell strings can be associated with (e.g., coupled to) select circuits. For example, sub-block SB0 of block BLK0 has memory cell strings 231a, 232a, and 233a and associated select circuits (e.g., drain select circuits) 241a, 242a, and 243a, and select circuits (e.g., source select circuits) 241'a, 242'a, and 243'a. Sub-block SB1 of block BLK0 has memory cell strings 234a, 235a, and 236a and associated select circuits (e.g., drain select circuits) 244a, 245a, and 246a, and select circuits (e.g., source select circuits) 244'a, 245'a, and 246'a.

Sub-block SB0 of block BLK1 has memory cell strings 231b, 232b, and 233b, and associated select circuits (e.g., drain select circuits) 241b, 242b, and 243b, and select circuits (e.g., source select circuits) 241'b, 242'b, and 243'b. Sub-block SB1 of block BLK1 has memory cell strings 234b, 235b, and 236b, and associated select circuits (e.g., drain select circuits) 244b, 245b, and 246b, and select circuits (e.g., source select circuits) 244'b, 245'b, and 246'b.

Sub-block SB0 of BLKi has memory cell strings 231c, 232c, and 233c, and associated select circuits (e.g., drain select circuits) 241c, 242c, and 243c, and select circuits (e.g., source select circuits) 241'c, 242'c, and 243'c. The sub-blocks of the blocks (e.g., blocks BLK0, BLK1 through BLKi) of memory device 200 can have the same number of memory cell strings and associated select circuits.

FIG. 2 shows an example of three memory cell strings and their associated circuits in a sub-block (e.g., in sub-block SB0). The number of memory cell strings and their associated select circuits in each the sub-block of blocks BLK0, BLK1 through BLKi can vary.

Memory device 200 can include data lines 270, 271, and 272 that carry signals BL0, BL1, and BL2, respectively. Each of data lines 270, 271, and 272 can be structured as a conductive line (which includes conductive materials). The memory cell strings of blocks BLK0, BLK1 through BLKi can share data lines 270, 271, and 272.

For example, memory cell strings 231a, 234a (of block BK0), 231b, 234b (of block BLK1), and 231c (of BLKi) can share data line 270.

Memory cell strings 232a, 235a (of block BK0), 232b, 235b (of block BLK1), and 232c (of block BLKi) can share data line 271.

Memory cell strings 233a, 236a (of block BK0), 233b, 236b (of block BK1), and 233c (of block BKi) can share data line 272. FIG. 2 shows three data lines 270, 271, and 272 as an example. The number of data lines can vary.

Memory device 200 can include a line 299 that can carry a signal SRC (e.g., source line signal). Line 299 can be structured as a conductive line (which includes conductive materials) and can form part of a source (e.g., a source line) of memory device 200. Blocks BLK0, BLK1 through BLKi can share line 299. Alternatively, each of blocks BLK0, BLK1 through BLKi can have its own line (e.g., source) similar to line 299.

Memory device 200 can include access lines in blocks BLK0, BLK1 through BLKi in which the access lines are electrically separated from each other within the same block and electrically separated from block to block. As shown in FIG. 2, each of blocks BLK0, BLK1, BLK2, and BLK3 can include its own access lines associated with signals (e.g., word line signals) WL0, WL1, WL2, and WL3. For example, in block BLK0, memory device 200 includes access lines (which can be or can include word lines) $220_0$, $221_0$, $222_0$, and $223_0$ (e.g., a group of access lines) that can carry corresponding signals (e.g., word line signals) $WL0_0$, $WL1_0$, $WL2_0$, and $WL3_0$, respectively.

In block BLK1, memory device 200 includes access lines (which can be or can include word lines) $220_1$, $221_1$, $222_1$, and $223_1$ (e.g., a group of access lines) that can carry corresponding signals (e.g., word line signals) $WL0_1$, $WL1_1$, $WL2_1$, and $WL3_1$, respectively.

In block BLKi, memory device 200 includes access lines (which can be or can include word lines) $220_i$, $221_i$, $222_i$, and $223_i$ that can carry corresponding signals (e.g., word line signals) $WL0_i$, $WL1_i$, $WL2_i$, and $WL3_i$.

Access lines $220_0$ through $223_0$, $220_1$ through $223_1$, and $220_1$ through $223_1$ can be structured as conductive access lines (which include conductive materials) that can form part of respective access lines of memory device 200 to access memory cells in a respective block. FIG. 2 shows four access lines ($220_0$ through $223_0$, $220_1$ through $223_1$, or $220_1$ through $223_1$) in each of blocks BLK0, BLK1 through BLKi as an example. The number of access lines can vary.

In sub-block SB0 of block BK0, memory device 200 includes select lines (e.g., drain select lines) $280_0$, $281_0$, $282_0$, and $283_0$ that can be shared by select circuits 241a, 242a, and 243a. In sub-block SB1 of block BK0, memory device 200 includes select lines (e.g., drain select lines) $280_1$, $281_1$, $282_1$, and $283_1$ that can be shared by select circuits 244a, 245a, and 246a. Block BLK0 can include select lines (e.g., source select lines) 284, 285, and 286 that can be shared by select circuits 241'a, 242'a, 243'a, 244'a, 245'a, and 246'a.

In sub-block SB0 of block BLK1, memory device 200 includes select lines (e.g., drain select lines) $280_0$, $281_0$, $282_0$, and $283_0$ that can be shared by select circuits 241b, 242b, and 243b. In sub-block SB1 of block BLK1, memory device 200 includes select lines (e.g., drain select lines) $280_1$, $281_1$, $282_1$, and $283_1$ that can be shared by select circuits 244b, 245b, and 246b. Block BLk1 can include select lines (e.g., source select lines) 284, 285, and 286 that can be shared by select circuits 241'b, 242'b, 243'b, 244'b, 245'b, and 246'b.

In sub-block SB0 of block BLKi, memory device 200 includes select lines (e.g., drain select lines) $280_0$, $281_0$, $282_0$, and $283_0$ that can be shared by select circuits 241c, 242c, and 243c; and select lines (e.g., source select lines) 284, 285, and 286 that can be shared by select circuits 241'c, 242'c, and 243'c.

FIG. 2 shows an example where memory device 200 includes four drain select lines (e.g., $280_0$, $281_0$, $282_0$, and $283_0$) associated with a drain select circuit (e.g., 241a, 242a, or 243a) in a sub-block (e.g., sub-block SB0 of block BLK0). However, memory device 200 can include fewer or more than four drain select lines associated with a drain select circuit. Similarly, FIG. 2 shows an example where memory device 200 includes three source select lines (e.g., 284, 285, and 286) associated with a source select circuit (e.g., 241'a, 242'a, or 243'a) in a sub-block (e.g., sub-block SB0 of block BLK0). However, memory device 200 can include fewer or more than three source select lines associated with a source select circuit.

Figure 4:
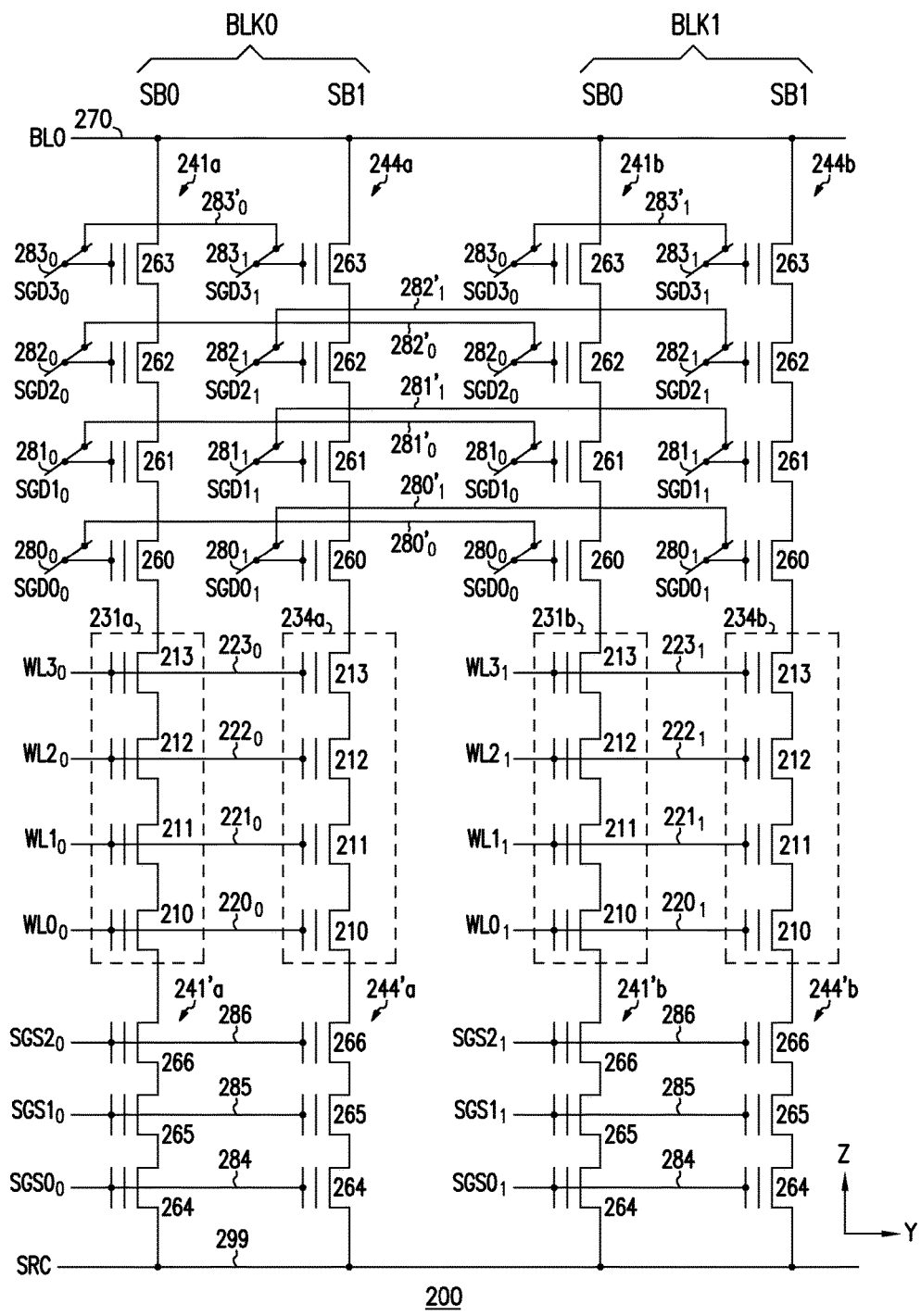
FIG. 4 shows a schematic diagram of a portion of the memory device of FIG. 3, according to some embodiments described herein.
Figure 6:
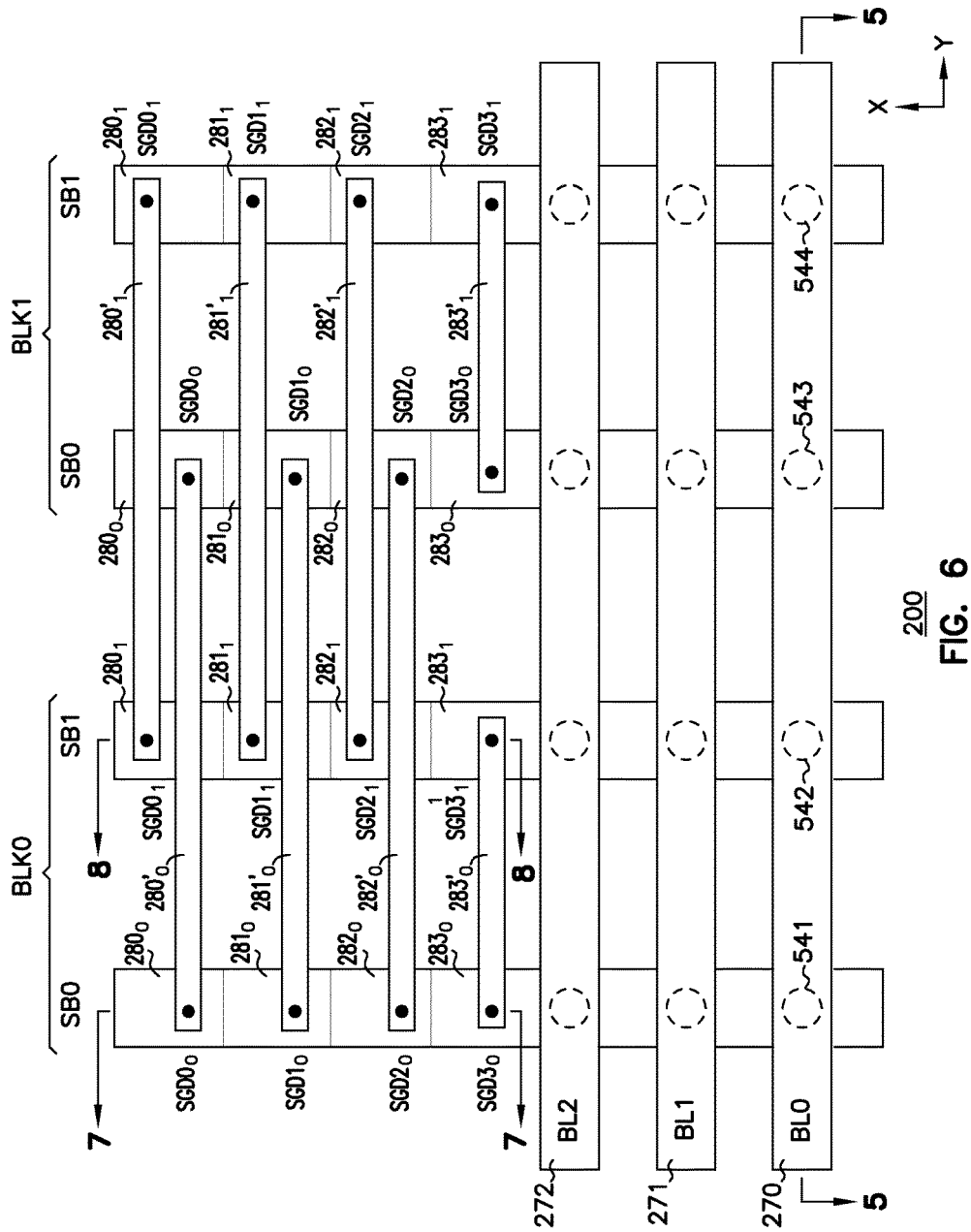
FIG. 6 shows a top view of a structure of the portion of the memory device including the portion shown in FIG. 5, according to some embodiments described herein.

Memory device 200 can include connections $280'_0$, $281'_0$, $282'_0$, $283'_0$, $280'_1$, $281'_1$, $282'_1$, $283'_1$, where each of which can electrically connect two respective select lines. FIG. 2 shows connections $280'_0$, $281'_0$, $282'_0$, $283'_0$, $280'_1$, $281'_1$, $282'_1$, $283'_1$ by themselves to avoid crowding the elements shown in FIG. 2. However, FIG. 4 and FIG. 6 show example routings of connections $280'_0$, $281'_0$, $282'_0$, $283'_0$, $280'_1$, $281'_1$, $282'_1$, $283'_1$ of FIG. 2.

FIG. 2 shows a connection $280'_0$ to indicate select line $280_0$ of sub-block SB0 of block BLK0 (sometimes referred to as select line $280_0$/SB0/BLK0) and select line $280_0$ of sub-block SB0 of block BLK1 (sometimes referred to as select line $280_0$/SB0/BLK1) can be in electrical contact (e.g., can be electrically connected) to each other through connection $280'_0$. Thus, in memory device 200, select lines $280_0$/SB0/BLK0 and $280_0$/SB0/BLK1 can be provided (e.g., applied) with the same signal. This also means that select lines $280_0$/SB0/BLK0 and $280_0$/SB0/BLK1 can receive the same signal during an operation (e.g., read, write, or erase operation) of memory device 200.

FIG. 2 shows a connection $281'_0$ to indicate select line $281_0$ of sub-block SB0 of block BLK0 (sometimes referred to as select line $281_0$/SB0/BLK0) and select line $281_0$ of sub-block SB0 of block BLK1 (sometimes referred to as select line $281_0$/SB0/BLK1) can be in electrical contact (e.g., can be electrically connected) to each other through connection $281'_0$. Thus, in memory device 200, select lines $281_0$/SB0/BLK0 and $281_0$/SB0/BLK1 can be provided (applied) with the same signal. This also means that select lines $281_0$/SB0/BLK0 and $281_0$/SB0/BLK1 can receive the same signal during an operation (e.g., read, write, or erase operation) of memory device 200.

FIG. 2 shows a connection $282'_0$ to indicate select line $282_0$ of sub-block SB0 of block BLK0 (sometimes referred to as select line $282_0$/SB0/BLK0) and select line $282_0$ of sub-block SB0 of block BLK1 (sometimes referred to as select line $282_0$/SB0/BLK1) can be in electrical contact (e.g., can be electrically connected) to each other through connection $282'_0$. Thus, in memory device 200, select lines $282_0$/SB0/BLK0 and $282_0$/SB0/BLK1 can be provided (applied) with the same signal. This also means that select lines $282_0$/SB0/BLK0 and $282_0$/SB0/BLK1 can receive the same signal during an operation (e.g., read, write, or erase operation) of memory device 200.

FIG. 2 shows a connection $283'_0$ to indicate select line $283_0$ of sub-block SB0 of block BLK0 (sometimes referred to as select line $283_0$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_0$. Thus, in memory device 200, select lines $283_0$/SB0/BLK0 and $283_1$/SB0/BLK0 can be provided (applied) with the same signal. This also means that select lines $283_0$/SB0/BLK0 and $283_1$/SB0/BLK1 can receive the same signal during an operation (e.g., read, write, or erase operation) of memory device 200.

FIG. 2 shows a connection $280'_1$ to indicate select line $280_1$ of sub-block SB1 of block BLK0 (sometimes referred to as select line $280_1$/SB1/BLK0) and select line $280_1$ of sub-block SB1 of block BLK1 (sometimes referred to as select line $280_1$/SB1/BLK1) can be in electrical contact (e.g., can be electrically connected) to each other through connection $281'_1$. Thus, in memory device 200, select lines $280_1$/SB1/BLK0 and $280_1$/SB1/BLK1 can be provided (applied) with the same signal. This also means that select lines $280_1$/SB1/BLK0 and $280_1$/SB1/BLK1 can receive the same signal during an operation (e.g., read, write, or erase operation) of memory device 200.

FIG. 2 shows a connection $281'_1$ to indicate select line $281_1$ of sub-block SB1 of block BLK0 (sometimes referred to as select line $281_1$/SB1/BLK0) and select line $281_1$ of sub-block SB1 of block BLK1 (sometimes referred to as select line $281_1$/SB1/BLK1) can be in electrical contact (e.g., can be electrically connected) to each other. Thus, in memory device 200, select lines $281_1$/SB1/BLK0 and $281_1$/SB1/BLK1 can be provided (applied) with the same signal. This also means that select lines $281_1$/SB1/BLK0 and $281_1$/SB1/BLK1 can receive the same signal during an operation (e.g., read, write, or erase operation) of memory device 200.

FIG. 2 shows a connection $282'_1$ to indicate select line $282_1$ of sub-block SB1 of block BLK0 (sometimes referred to as select line $282_1$/SB1/BLK0) and select line $282_1$ of sub-block SB1 of block BLK1 (sometimes referred to as select line $282_1$/SB1/BLK1) can be in electrical contact (e.g., can be electrically connected) to each other through connection $282'_1$. Thus, in memory device 200, select lines $282_1$/SB1/BLK0 and $282_1$/SB1/BLK1 can be provided (applied) with the same signal. This also means that select lines $282_1$/SB1/BLK0 and $282_1$/SB1/BLK1 can receive the same signal during an operation (e.g., read, write, or erase operation) of memory device 200.

FIG. 2 shows a connection $283'_1$ to indicate select line $283_1$ of sub-block SB0 of block BLK0 (sometimes referred to as select line $283_1$/SB0/BLK0) and select line $283_1$ of sub-block SB0 of block BLK0 (sometimes referred to as select line $283_1$/SB0/BLK0) can be in electrical contact (e.g., can be electrically connected) to each other through connection $283'_1$. Thus, in memory device 200, select lines $283_1$/SB0/BLK0 and $283_1$/SB0/BLK0 can be provided (applied) with the same signal. This also means that select lines $283_1$/SB0/BLK0 and $283_1$/SB0/BLK0 can receive the same signal during an operation (e.g., read, write, or erase operation) of memory device 200.

In the structure of memory device 200, each of connections $280'_0$, $281_0$, $282'_0$, $283'_0$, $280'_1$, $281_1$, $282'_1$, $283'_1$ can include a conductive material that is formed to be in electrical contact with the materials of two respective select lines. For example, connection $283'_0$ can include a conductive material that is formed to be in electrical contact with the material that form select lines $283_0$/SB0/BLK0 and the material that form select line $283_1$/SB0/BLK0. In another example, connection $282'_0$ can include a conductive material that is formed to be in electrical contact with the material that forms select lines $282_0$/SB0/BLK0 and the material that form select line $282_1$/SB0/BLK0.

The material (or materials) of each of connection $280'_0$, $281_0$, $282'_0$, $283'_0$, $280'_1$, $281_1$, $282'_1$, $283'_1$ can include metal, doped polysilicon, or other conductive materials.

Each of the drain select circuits of memory device 200 can include multiple drain select gates connected in series (e.g., four transistors connected in series, shown in FIG. 3) between a respective data line and a respective memory cell string. The drain select gates can be controlled (e.g., turned on or turned off) by respective drain select lines based on voltages provided to the signals on the respective drain select lines.

Each of the source select circuits of memory device 200 can include multiple source select gates connected in series (e.g., three transistors connected in series, shown in FIG. 3) between line 299 and a respective memory cell string. The source select gates can be controlled (e.g., turned on or turned off) by respective source select lines based on voltages provided to the signals on the respective source select lines.

In FIG. 2, each of the memory cell strings of memory device 200 has memory cells (shown in FIG. 3) arranged in a string (e.g., coupled in series among each other) to store information. During an operation (e.g., read, write, or erase operation) of memory device 200, the memory cell strings can be individually selected to access the memory cells in the selected memory cell string in order to store information in or read information from the selected memory cell string. One or both select circuits (a drain select circuit and a source select circuit) associated with a selected memory cell string can be activated (e.g., by turning on the select gates (e.g., transistors) in the select circuit (or selected circuits)), depending on which operation memory device 200 performs on the selected memory cell string.

Activating a particular select circuit among the select circuits of memory device 200 during an operation of memory device 200 can include providing (e.g., applying) voltages having certain values to the signals on select lines associated with that particular select circuit. When a particular drain select circuit of memory device 200 is activated, it can electrically connect (e.g., form a current path from) a selected memory cell string associated with that particular select circuit to a respective data line (e.g., one of data lines 270, 271, or 272). When a particular source select circuit is activated, it can electrically connect (e.g., form a current path from) a selected memory cell string associated with that particular select circuit to a source (e.g., line 299).

Figure 3:
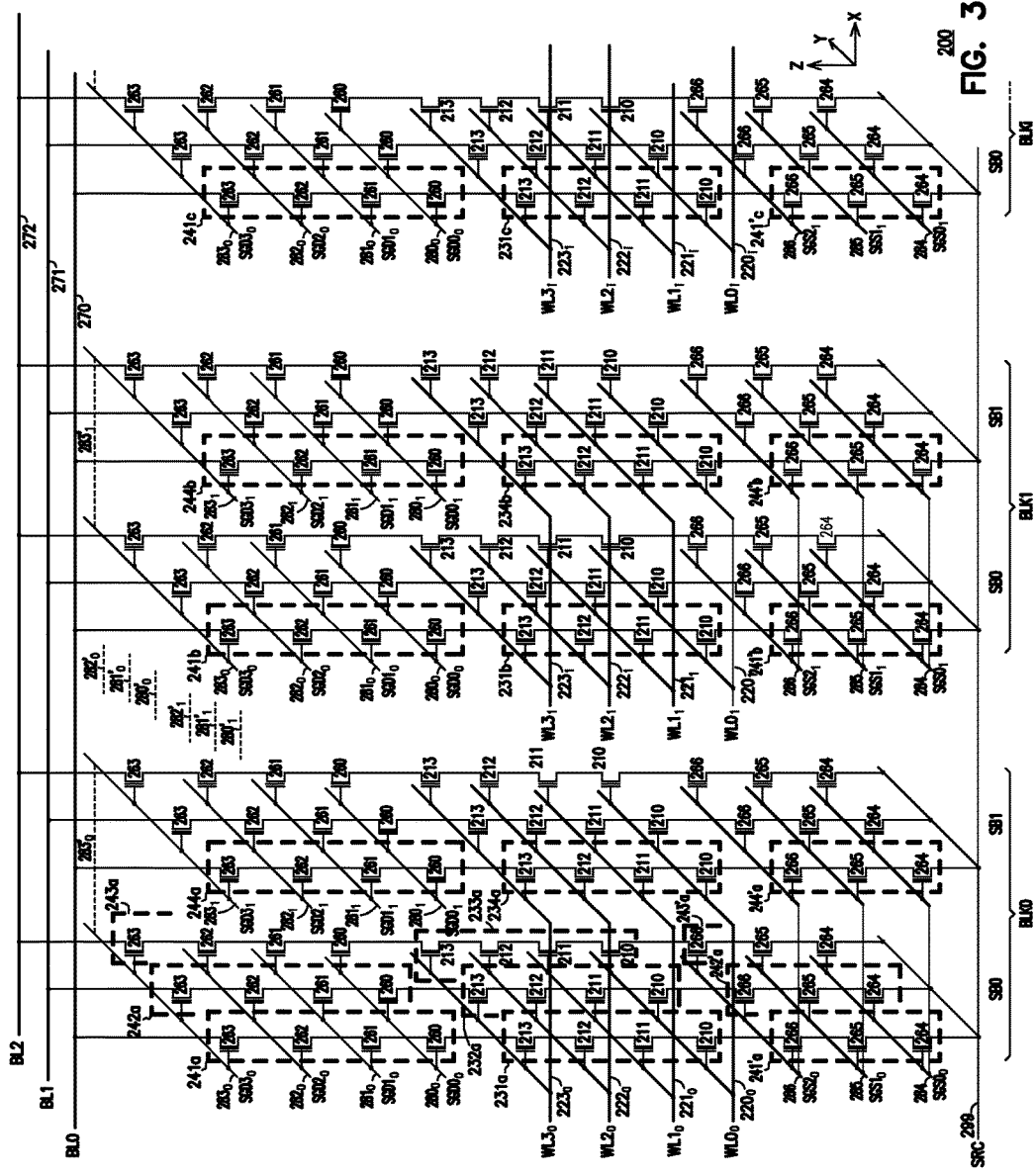
FIG. 3 shows a schematic diagram of the memory device of FIG. 2, according to some embodiments described herein.

FIG. 3 shows a schematic diagram of memory device 200 of FIG. 2, according to some embodiments described herein. For simplicity, only some of the memory cell strings and some of the select circuits of memory device 200 of FIG. 2 are labeled in FIG. 3.

As shown in FIG. 3, each select line can carry an associated select signal. For example, in sub-block S0 of block BLK0, select lines (e.g., drain select lines) $280_0$, $281_0$, $282_0$, and $283_0$ can carry associated signals (e.g., drain select-gate signals) $SGD0_0$, $SGD1_0$, $SGD2_0$, and $SGD3_0$, respectively. Select lines (e.g., source select lines) 284, 285, and 286, can carry associated signals (e.g., source select-gate signals) $SGS0_0$, $SGS1_0$, and $SGS2_0$, respectively.

In sub-block SB1 of block BLK0, select lines (e.g., drain select lines) $280_1$, $281_1$, $282_1$, and $283_1$ can carry associated signals $SGD0_1$, $SGD1_1$, $SGD2_1$, and $SGD3_1$, respectively. Select lines (e.g., source select lines) 284, 285, and 286, can carry associated signals $SGS0_1$, $SGS1_1$, and $SGS2_1$, respectively.

In sub-block SB0 of block BLK1, select lines (e.g., drain select lines) $280_0$, $281_0$, $282_0$, and $283_0$ can carry associated signals $SGD0_0$, $SGD1_0$, $SGD2_0$, and $SGD3_0$, respectively. Select lines (e.g., source select lines) 284, 285, and 286, can carry associated signals $SGS0_0$, $SGS1_0$, and $SGS2_0$, respectively.

In sub-block SB1 of block BLK1, select lines (e.g., drain select lines) $280_1$, $281_1$, $282_1$, and $283_1$ can carry associated signals $SGD0_1$, $SGD1_1$, $SGD2_1$, and $SGD3_1$, respectively. Select lines (e.g., source select lines) 284, 285, and 286, can carry associated signals $SGS0_1$, $SGS1_1$, and $SGS2_1$, respectively.

Thus, as shown in FIG. 3, some of the drain select lines of each sub-block (e.g., SB0 or SB1) of the same block (e.g., block BLK0) can be provided (applied) with its own set of drain select gate signals (e.g., a set of signals $SGD0_0$, $SGD1_0$, and $SGD2_0$, or a set of signals $SGD0_1$, $SGD1_1$, and $SGD2_1$) that is different from the set of drain select line signals of the other sub-block of the same block. However, some of drain select lines of two sub-blocks (e.g., SB0/BK and SB0/BK1) of different blocks (e.g., neighboring blocks) can be provided (applied) with the same set of drain select signals. For example, sub-block SB0 of block BLK0 and sub-block SB0 of block BLK1 can be provided (applied) with the same set of signals $SGD0_0$, $SGD1_0$, and $SGD2_0$. In another example, sub-block SB1 of block BLK0 and sub-block SB1 of block BLK1 can be provided (applied) with the same set of signals $SGD0_1$, $SGD1_1$, and $SGD2_1$. The source select lines of the sub-blocks (e.g., SB0 and SB1) of the same block (e.g., block BLK0) can be provided (applied) with the same set of set of source gate signals (e.g., a set of signals $SGS0_0$, $SGS1_0$, and $SGS2_0$).

As shown in FIG. 3, memory device 200 can include memory cells 210, 211, 212, and 213; select gates (e.g., drain select gates or transistors) 260, 261, 262, 263; and select gates (e.g., source select gates or transistors) 264, 265, and 266 that can be physically arranged in three dimensions (3D), such as x, y, and z directions (e.g., dimensions), with respect to the structure (shown in FIG. 5) of memory device 200.

Each of the memory cell strings (e.g., memory cell strings 231*a*, 232*a*, 233*a*, 234*a*, 231*b*, 234*b*, 231*c*) of memory device 200 can include one of memory cells 210, one of memory cells 211, one of memory cells 212, and one of memory cells 213. FIG. 3 shows an example of four memory cells 210, 211, 212, and 213 in each memory cell string. The number of memory cells in each memory cell string can vary. Moreover, one skilled in the art would recognize that some of the memory cells among memory cells 210, 211, 212, and 213 of the memory cell strings of memory device 200 may be dummy memory cells. Dummy memory cells are memory cells that are not configured to store information. Dummy memory cells may be configured for purposes known to those skilled in the art. In some examples of memory device 200, one or two (or more) of memory cells at the two ends of each the memory cell strings of memory device 200 (e.g., memory cells immediately next to select gates 260, select gates 266, or both select gates 260 and 266) may be dummy memory cells.

As shown in FIG. 3, each of select circuits (e.g., drain select circuits) 241*a*, 242*a*, 243*a*, 244*a*, 241*b*, 244*b*, and 241*c* can include four select gates: one of select gates 260, one of select gates 261, one of select gates 262, and one of select gates 263. FIG. 3 shows an example where memory device 200 includes four drain select gates (e.g., 260, 262, 263, and 264) in each drain select circuit. However, memory device 200 can include fewer or more than four drain select gates in each drain select circuit, depending on the number of drain select lines associated with each drain select circuit. The number of drain select gates (e.g., four in the example of in FIG. 3) in each drain select circuit can be equal to the number of drain select lines (e.g., four in the example of in FIG. 3) associated with each drain select circuit.

Each of select circuits (e.g., source select circuits) 241'*a*, 242'*a*, 243'*a*, 244'*a*, 241'*b*, 244'*b*, and 241'*c* can include three select gates: one of select gates 264, one of select gates 265, and one of select gates 266. FIG. 3 shows an example where memory device 200 includes three source select gates (e.g., 264, 265, and 266) in each source select circuit. However, memory device 200 can include fewer or more than three source select gates in each source select circuit, depending on the number of source select lines associated with each source select circuit. The number of source select gates (e.g., three in the example of in FIG. 3) in each source select circuit can be equal to the number of source select lines (e.g., three in the example of in FIG. 3) associated with each source select circuit.

Each of select gates 260 through 266 can operate as a transistor. For example, select gate 260 of select circuit 241*a* can operate as a field effect transistor (FET), such as a metal-oxide semiconductor FET (MOSFET). An example of such a MOSFET include an n-channel MOS (NMOS) transistor.

As shown in FIG. 3, a select line shared among particular select circuits can be shared by respective select gates of those particular select circuits. For example, select line $280_0$ of sub-block SB0 of block BLK0 can be shared by select gates 260 of select circuits 241*a*, 242*a*, and 243*a* of sub-block SB0 of block BLK0. Select line $281_0$ of sub-block SB0 of block BLK0 can be shared by select gates 261 of select circuits 241*a*, 242*a*, and 243*a* of sub-block SB0 of block BLK0. Select line $282_0$ of sub-block SB0 of block BLK0 can be shared by select gates 262 of select circuits 241*a*, 242*a*, and 243*a* of sub-block SB0 of block BLK0. Select line $283_0$ of sub-block SB0 of block BLK0 can be shared by select gates 260 of select circuits 241*a*, 242*a*, and 243*a* of sub-block SB0 of block BLK0.

In another example, select line 284 of sub-block SB0 of block BLK0 can be shared by select gates 264 of select circuits 241'a, 242'a, and 243'a of sub-block SB0 of block BLK0. Select line 285 of sub-block SB0 of block BLK0 can be shared by select gates 265 of select circuits 241'a, 242'a, and 243'a of sub-block SB0 of block BLK0. Select line 286 of sub-block SB0 of block BLK0 can be shared by select gates 266 of select circuits 241'a, 242'a, and 243'a of sub-block SB0 of block BLK0.

A select line (e.g., select line $280_0$ of sub-block SB0 of block BLK0) can carry a signal (e.g., signal $SGD0_0$) but it does not operate like a switch (e.g., a transistor). A select gate (e.g., select gate 260 of select circuit 241a of sub-block SB0 of block BLK0) can receive a signal (e.g., signal $SGD0_0$) from a respective select line (e.g., select line $280_0$ of sub-block SB0 of block BLK0) and can operate like a switch (e.g., a transistor).

In the physical structure of memory device 200, a select line (e.g., select line $280_0$ of sub-block SB0 of block BLK0) can be a piece (e.g., a layer) of conductive material. The conductive material can include metal, doped polysilicon, or other conductive materials.

In the physical structure of memory device 200, a select gate (e.g., select gate 260 of select circuit 241a of sub-block SB0 of block BLK0) can include (can be formed from) a portion of the conductive material of a respective select line (e.g., select line $280_0$ of sub-block SB0 of block BLK0), a portion of a channel material (e.g., polysilicon channel), and a portion of a dielectric material (e.g., similar to a gate oxide of a transistor (e.g., FET)) between the portion of the conductive material and the portion of the channel material.

In order to focus on the embodiments discussed herein, the description below with reference to FIG. 4 through FIG. 8 focuses on a portion of memory device 200 that includes data line BL0 and elements of sub-blocks SB0 and SB1 of blocks BLK0 and BLK1 coupled to data line BL0. Other data lines and associated elements of sub-blocks SB0 and SB1 of blocks BLK0 and BLK1 coupled to the other data lines of memory device 200 have similar structures and connections.

FIG. 4 shows a schematic diagram of a portion of memory device 200 of FIG. 3, according to some embodiments described herein. As shown in FIG. 4, the portion of memory device 200 includes data line 270 and line (e.g., source) 299; the elements of sub-blocks SB0 and SB1 of block BLK0 include drain select circuits (241a and 244a), memory cell strings (231a and 234a), and source select circuits 241'a and 244'a; and the elements of sub-blocks SB0 and SB1 of block BLK1 include drain select circuits (241b and 244b), memory cell strings (231b and 234b), and source select circuits 241'b and 244'b.

FIG. 4 also shows connection $283'_0$ between sub-blocks SB0 and SB1 of block BLK0, connection $283'_1$ between sub-blocks SB0 and SB1 of block BLK1, and connections $280'_0$, $281'_0$, $282'_0$, $280'_1$, $281'_1$, and $282'_1$ between blocks BLK0 and BLK1. These connections ($280'_0$, $281'_0$, $282'_0$, $283'_0$, $280'_1$, $281'_1$, and $282'_1$, $283'_1$) are also described above in the description with reference to FIG. 2.

As shown in FIG. 4, select gates (e.g., drain select gates) 260, 261, 262, and 263 of each of select circuits (e.g., 241a, 244a, 241b, and 244b of respective blocks BLK0 and BLK1) can be coupled in series with each other between data line 270 and a respective memory cell string (e.g., one of memory cell strings 231a, 234a, 231b, and 234b). Select gates (e.g., source select gates) 264, 265, and 266 of each of select circuits (e.g., 241'a, 244'a, 241'b, and 244'b of respective blocks BLK0 and BLK1) can be coupled in series with each other between line 299 and a respective memory cell string (e.g., one of memory cell strings 231a, 234a, 231b, and 234b).

Signals $SGD0_0$, $SGD1_0$, and $SGD2_0$ can be provided with voltages to control (e.g., turn on or turn off) select gates 260, 261, and 262, respectively, of sub-block SB0 of each of blocks BLK0 and BLK1.

Signals $SGD0_1$, $SGD1_1$, and $SGD2_1$ can be provided with voltages to control (e.g., turn on or turn off) select gates 260, 261, and 262, respectively, of sub-block SB1 of each of blocks BLK0 and BLK1.

Signal $SGD3_0$ can be provided with voltages to control (e.g., turn on or turn off) select gates 263 of sub-blocks SB0 and SB1 block BLK0. Signal $SGD3_1$ can be provided with voltages to control (e.g., turn on or turn off) select gates 263 of sub-blocks SB0 and SB1 block BLK1.

Signals $SGS0_0$, $SGS1_0$, and $SGS2_0$ can be provided with voltages to control (e.g., turn on or turn off) select gates 264, 265, and 266, respectively, of sub-blocks SB0 and SB1 of block BLK0.

Signals $SGS0_1$, $SGS1_1$, and $SGS2_1$ can be provided with voltages to control (e.g., turn on or turn off) select gates 264, 265, and 266, respectively, of sub-blocks SB0 and SB1 of block BLK1.

During an operation (e.g., a read or write operation), a selected sub-block is the sub-block selected by memory device 200 to store information in or read information from a memory cell (or memory cells) of the selected sub-block. A sub-block can be selected based on information (e.g., decoded address information) decoded by decoding circuitry of memory device 200 (such decoding circuitry can be similar to circuitry 108 and 109 of FIG. 1). During an operation of memory device 200, an unselected (non-selected) sub-block is the sub-block not being selected by memory device 200. Memory cell strings of unselected sub-blocks are unselected memory cell strings. During an operation (e.g., read or write operation) performed on a selected memory cell string (e.g., performed on a selected memory cell) of a selected sub-block, information is not read from or stored in memory cells of unselected memory cell strings.

During an operation (e.g., a read or write operation) of memory device 200, the sub-blocks (e.g., SB0 and SB1) of blocks BLK0 and BLK1 can be selected one at time (e.g., sequentially selected). For example, in the portion of the memory device 200 of FIG. 4, only one sub-block among sub-block SB0 of block BLK0, sub-block SB1 of block BLK0, sub-block SB0 of block BLK1, and sub-block SB1 of block BLK1 can be selected to be electrically connected to data line 270 at a time.

In FIG. 4, during a write (e.g., program) operation of memory device 200, select gates 260, 261, 262, and 263 of a selected sub-block can be turned on, and select gates 264, 265, and 266 of the selected sub-block and the unselected sub-blocks can be turned off. During a read operation (and also during a program verify stage of a write operation and an erase verify stage of an erase operation) of memory device 200, select gates 260 through 266 of a selected sub-block can be turned on, and at least one select gate of the unselected sub-block can be turned off. During an erase operation of memory device 200, one of the blocks (e.g., BLK0 or BLK1) of memory device 200 can be selected to erase information from memory cells 210, 211, 212, and 213 of the selected block.

Figure 5:
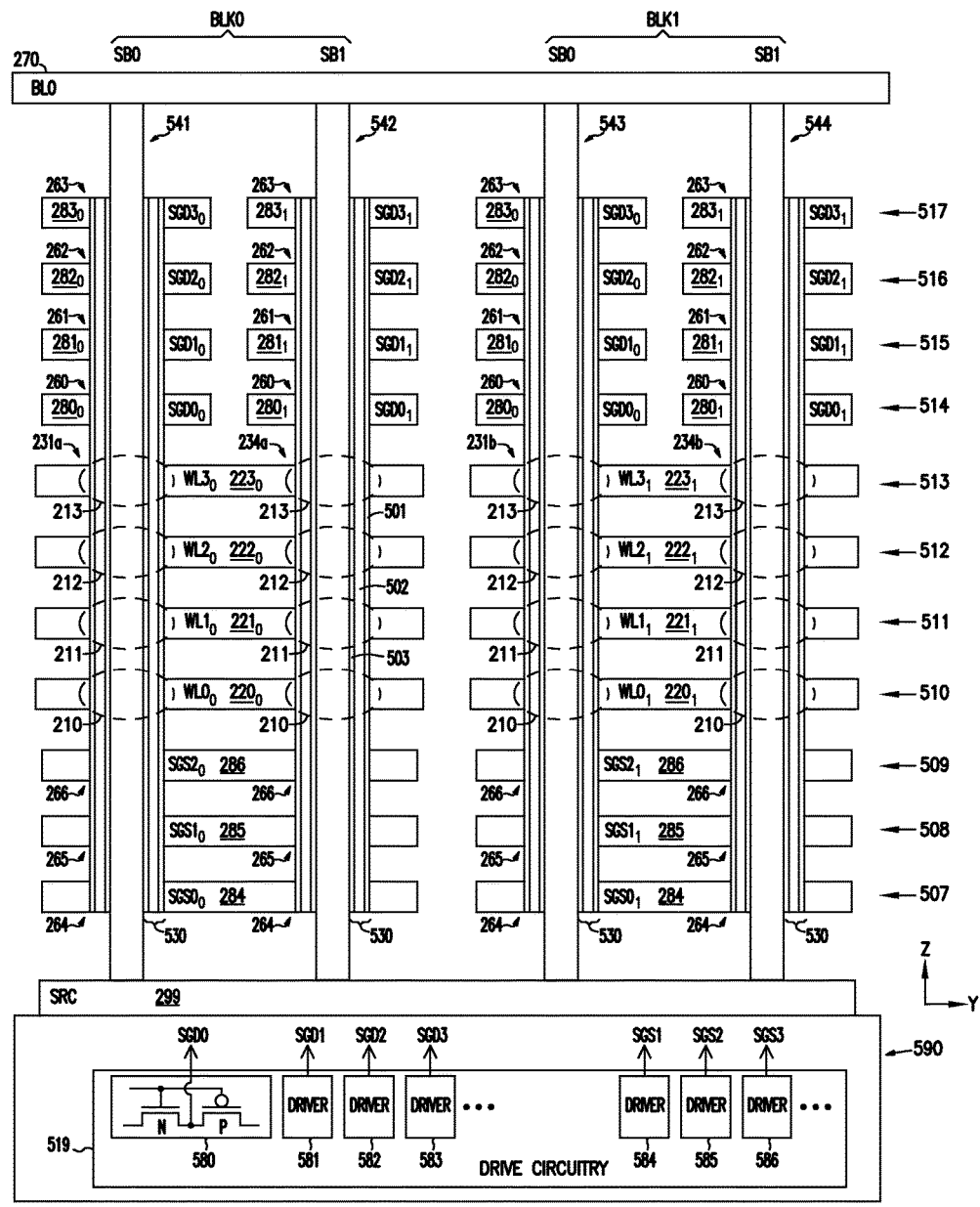
FIG. 5 shows a side view of a structure of a portion of the memory device of FIG. 2, FIG. 3, and FIG. 4, according to some embodiments described herein.

FIG. 5 shows a side view of a structure of a portion of memory device 200, according to some embodiments described herein. The structure of memory device 200 in FIG. 5 corresponds to part of the schematic diagram of memory device 200 shown in FIG. 4. As shown in FIG. 5, memory device 200 can include a substrate 590 over which memory cells 210, 211, 212, and 213 of memory cell strings 231a, 234a, 231b, and 234b of respective sub-blocks SB0 and SB1 of blocks BLK0 and BLK1 can be formed (e.g., formed vertically in z-direction with respect to line 299 and substrate 590). Memory device 200 includes different levels 507 through 517 with respect to a z-direction. Levels 507 through 517 are internal device levels between substrate 590 and data line 270.

Substrate 590 of memory device 200 can include monocrystalline (also referred to as single-crystal) semiconductor material. For example, substrate 590 can include monocrystalline silicon (also referred to as single-crystal silicon). The monocrystalline semiconductor material of substrate 590 can include impurities, such that substrate 590 can have a specific conductivity type (e.g., n-type or p-type).

Memory device 200 can include drive circuitry 519 to provide signals (e.g., drain and source select line signals) to respective select lines of memory device 200. Drive circuitry 519 can correspond to drive circuitry 119 of FIG. 1. Although not shown in FIG. 5, substrate 590 can include circuitry that can be located directly under line 299. Such circuitry can include sense amplifiers, buffers (e.g., page buffers), decoders, and other circuit components of memory device 200.

As shown in FIG. 5, drive circuitry 519 can include drivers (driver circuits) 580, 581, 582, and 583 to provide respective signals (e.g., drain select line signals SGD0, SGD1, SGD2, and SGD3), and drivers (driver circuits) 584, 585, and 586 to provide respective signals (e.g., source select line signals SGS0, SGS1, and SGS2). In FIG. 5, only some of the drain and source select signals are shown for simplicity. However, drive circuitry 519 can provide all of drain and source select signals described above with reference to FIG. 3 and FIG. 4. For example, signals SGD0, SGD1, SGD2, and SGD3 can correspond to some of signals $SGD0_0$, $SGD1_0$, $SGD2_0$, $SGD3_0$, $SGD0_1$, $SGD1_1$, $SGD2_1$, and $SGD3_1$ (FIG. 3 and FIG. 4), and signals SGS0, SGS1, and SGS2 can correspond to some of signals $SGS0_0$, $SGS1_0$, $SGS2_0$, $SGS0_1$, $SGS1_1$, and $SGS2_1$ (FIG. 3 and FIG. 4).

In FIG. 5, each of drivers 580 through 586 can include two transistor N (e.g., NMOS) and P (e.g., p-channel MOS (PMOS)). For simplicity, detail of only one of drivers 580 through 584 is shown in FIG. 5. Each of drivers 580 through 586 can include an output node, e.g., a node located between and electrically connected to transistors N and P, to provide (e.g., drive) a respective signal (e.g., a drain select line signal or a source select line signal). The output node of each of drivers 580 through 586 can be coupled to (e.g., electrically connected to) a respective drain select line or a respective source select line of memory device 200. This allows the drain and source select line signals (e.g., SGD0, SGD1, SGD2, SGD3, SGS0, SGS1, and SGS2) from drive circuitry 519 to be provided to respective drain and source select lines of memory device 200 as described above with reference to FIG. 2 through FIG. 5.

FIG. 5 shows an example where each of drivers 580 through 586 can have two transistors of different transistor types (e.g., NMOS and PMOS) coupled in a complementary MOS (CMOS) connection. However, each of drivers 580 through 586 can have two transistors of the same types (e.g., two NMOS transistors or two PMOS transistors) and two separate transistor gate signals. Further, the number of transistors in each of drivers 580 through 586 may be different from two.

As shown in FIG. 5, data line 270 can have a length extending in the y-direction (e.g., shown in FIG. 3), which is perpendicular to the z-direction and the x-direction. Data line 270 can include a conductive material (e.g., conductively doped polycrystalline silicon (doped polysilicon), metals, or other conductive materials).

Line 299 can include a conductive material and can have a length extending in the y-direction. FIG. 5 shows an example where line 299 (e.g., source) can be formed over a portion of substrate 590 (e.g., by depositing a conductive material over substrate 590). Alternatively, line 299 can be formed in or formed on a portion of substrate 590 (e.g., by doping a portion of substrate 590).

As shown in FIG. 5, select lines (e.g., drain select lines) $280_0$, $281_0$, $282_0$, and $283_0$ of each of blocks BLK0 and BLK1 can be located in respective levels 514, 515, 516, and 517. Select lines (e.g., drain select lines) $280_1$, $281_1$, $282_1$, and $283_1$ of each of blocks BLK0 and BLK1 can be located in respective levels 514, 515, 516, and 517.

For simplicity, some of the connections of memory device 200 shown in FIG. 4 are not shown in FIG. 5. Such connections (not shown in FIG. 5) include connection $283'_0$ between select lines $283_0$ and $283_1$ (associated with respective signals $SGD3_0$ and $SGD3_1$) of block BLK0, connection $283'_1$ between select lines $283_0$ and $283_1$ (associated with respective signals $SGD3_0$ and $SGD3_1$) of block BLK1, and connections $280'_0$, $281'_0$, $282'_0$, $280'_1$, $281'_1$, and $282'_1$ between blocks BLK0 and BLK1.

As shown in FIG. 5, memory cells 210, 211, 212, and 213 of memory cell strings 231a, 234a, 231b, and 234b can be located in levels 510, 511, 512, and 513, respectively. Access lines $220_0$, $221_0$, $222_0$, and $223_0$ (associated with memory cells 210, 211, 212, and 213, respectively) of block BLK0 can be located in levels 510, 511, 512, and 513, respectively. Access lines $220_1$, $221_1$, $222_1$, and $223_1$ (associated with memory cells 210, 211, 212, and 213, respectively) of block BLK1 can be located in levels 510, 511, 512, and 513, respectively.

Select lines (e.g., source select lines) 284, 285, and 286 of each of blocks BLK0 and BLk1 can be located in different levels (e.g., levels 507, 508, and 509, respectively) between substrate 590 and memory cell strings 231a, 232a, and 233a.

Memory device 200 can also include dielectric materials (not labeled in FIG. 5) interleaved with other elements in different levels of memory device 200. For example, memory device 200 can include dielectric materials (e.g., silicon dioxide) located between levels 514 and 517 and interleaved with (located in the spaces between) select lines $280_0$, $281_0$, $282_0$, and $283_0$ of each of blocks BLK0 and BLK1.

In another example, memory device 200 can include a group of dielectric materials (e.g., silicon dioxide) located between levels 510 and 513 and interleaved with (located in the spaces between) access lines $220_0$, $221_0$, $222_0$, and $223_0$ of block BLK0. In another example, memory device 200 can include a group of dielectric materials (e.g., silicon dioxide) located between levels 510 and 513 and interleaved with (located in the spaces between) access lines $220_1$, $221_1$, $222_1$, and $223_1$ of block BLK1.

In another example, memory device 200 includes dielectric materials (e.g., silicon dioxide) located between levels 507 and 509 and interleaved with (located in the spaces between) select lines 284, 385, and 286.

The materials of select lines $280_0$, $281_0$, $282_0$, $283_0$, $280_1$, $281_1$, $282_1$, $283_1$, 284, 285, and 286 can include conductively doped polycrystalline silicon, metals, or other conductive materials and can be the same as the conductive material of access lines $220_0$, $221_0$, $222_0$, $223_0$, $220_1$, $221_1$, $222_1$, and $223_1$ As shown in FIG. 5, memory device 200 can include pillars (conductive pillars) pillars 541, 542, 543, and 544 in respective sub-blocks SB0 and SB1 of blocks BLK0 and BLK1. Each of pillars 541, 542, 543, and 544 can have a length extending outwardly (e.g., vertically in the direction of the z-direction and perpendicular to the y-direction). Each of pillars 541, 542, 543, and 544 can contact a conductive region of the material that forms part of data line 270 and contact a conductive region of the material that forms part of line 299.

Each of pillars 541, 542, 543, and 544 can include a material (or materials) to form a conductive path (e.g., a channel) between data line 270 and line 299. Such a material (e.g., undoped or doped polycrystalline silicon) of each of pillars 541, 542, 543, and 544 can be part of a channel (not shown in FIG. 5) of a respective pillar among pillars 541, 542, 543, and 544.

As shown in FIG. 5, memory device 200 can include a structure 530 adjacent a respective pillar of pillars 541, 542, 543, and 544 and extending continuously along a length of the respective pillar. Structure 530 is also adjacent portions of respective access lines ($220_0$, $221_0$, $222_0$, and $223_0$, or access lines $220_1$, $221_1$, $222_1$, and $223_1$). Structure 530 adjacent a respective pillar is located between the respective pillar and portions of respective access lines (access lines $220_0$, $221_0$, $222_0$, and $223_0$, or access lines $220_1$, $221_1$, $222_1$, and $223_1$). Structure 530 can include portions 501, 502, and 503. Parts of structure 530 along a particular pillar can form part of each of memory cells of the memory cell string adjacent that particular pillar. For example, structure 530 adjacent pillar 542 can form part of each of memory cells 210, 211, 212, and 213 of memory cell string 234a. Thus, each of memory cells 210, 211, 212, and 213 of a memory cell string can include part of structure 530 (part of each of portions 501, 502, and 503) located directly between one of the access lines (one of access lines $220_0$, $221_0$, $222_0$, and $223_0$, $220_1$, $221_1$, $222_1$, and $223_1$) and a respective pillar. For example, memory cell 212 of memory cell string 243a (adjacent pillar 542) can include part of each of portions 501, 502, and 503 located directly between access line $222_0$ and pillar 542.

Structure 530 can be part of a TANOS (TaN, $Al_2O_3$, $Si_3N_4$, $SiO_2$, Si) structure. For example, portion 501 (e.g., interpoly dielectrics) can include a charge blocking material or materials (e.g., a dielectric material such as TaN and $Al_2O_3$) that are capable of blocking a tunneling of a charge. Portion 502 can include a charge storage element (e.g., charge storage material or materials, such as $Si_3N_4$) that can provide a charge storage function (e.g., trap charge) to represent a value of information stored in memory cells 210, 211, 212, or 213. Portion 503 can include a dielectric, such as a tunnel dielectric material or materials (e.g., $SiO_2$) that are capable of allowing tunneling of a charge (e.g., electrons). As an example, portion 503 can allow tunneling of electrons from portion 504 to portion 502 during a write operation and tunneling of electrons from portion 502 to portion 504 during an erase operation of memory device 200. Moreover, portion 503 can allow tunneling of holes from portion 504 to portion 502, compensating the trapped electron recombination during an erase operation of memory device 200. In an alternative arrangement of memory device 200, structure 530 can be part of a SONOS (Si, $SiO_2$, $Si_3N_4$, $SiO_2$, Si) structure. In another alternative arrangement, structure 530 can be part of a floating gate structure (e.g., portion 502 can be polysilicon and each of portions 501 and 503 can be dielectric (e.g., $SiO_2$).

As shown in FIG. 5, a select line (e.g., $280_0$) is a piece (e.g., a single layer) of conductive material (e.g., polycrystalline silicon, metal, or other conductive materials). As described above, a select line can carry a signal (e.g., signal $SGD1_0$) but it does not operate like a switch (e.g., a transistor). A select gate (e.g., 260) can include a portion of a respective select line (e.g., a portion of the piece of the conductive material that forms the respective select line) and additional structures to perform a function (e.g., function of a transistor). For example, in FIG. 5, select gate 260 of sub-block SB0 of block BLK0 can include a portion of select line $280_0$ sub-block SB0 of block BLK0 and a portion of structure 530 (along pillar 541) adjacent select line $280_0$ of sub-block SB0 of block BLK0. In another example, select gate 261 of sub-block SB0 of block BLK0 can include a portion of select line $281_0$ sub-block SB0 of block BLK0 and a portion of structure 530 (along pillar 541) adjacent select line $281_0$ of sub-block SB0 of block BLK0.

FIG. 5 shows an example where select gates 261 through 266 have the same structure (e.g., TANOS structure) as memory cells 210, 211, 212, and 213. Alternatively, select gates 260, 261, 262, and 263 (e.g., drain select gate), select gates 264, 265, and 266 (e.g., source select gate), or select gates 260 through 266 can have a different structure, such as a FET structure. As is known to those skilled in the art, an FET usually includes a transistor gate, a transistor body channel, and a gate oxide between the transistor gate and the transistor body channel that can be in direct contact with the transistor gate and the transistor body channel.

Figure 7:
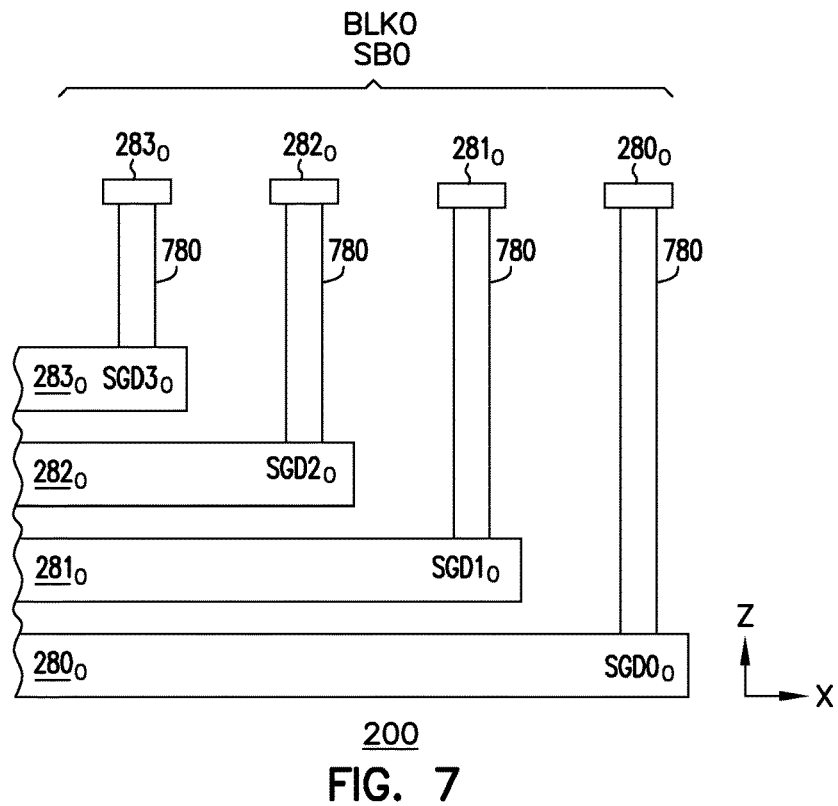
FIG. 7 shows a side view of drain select lines of a sub-block of a block of the memory device of FIG. 6, according to some embodiments described herein.
Figure 8:
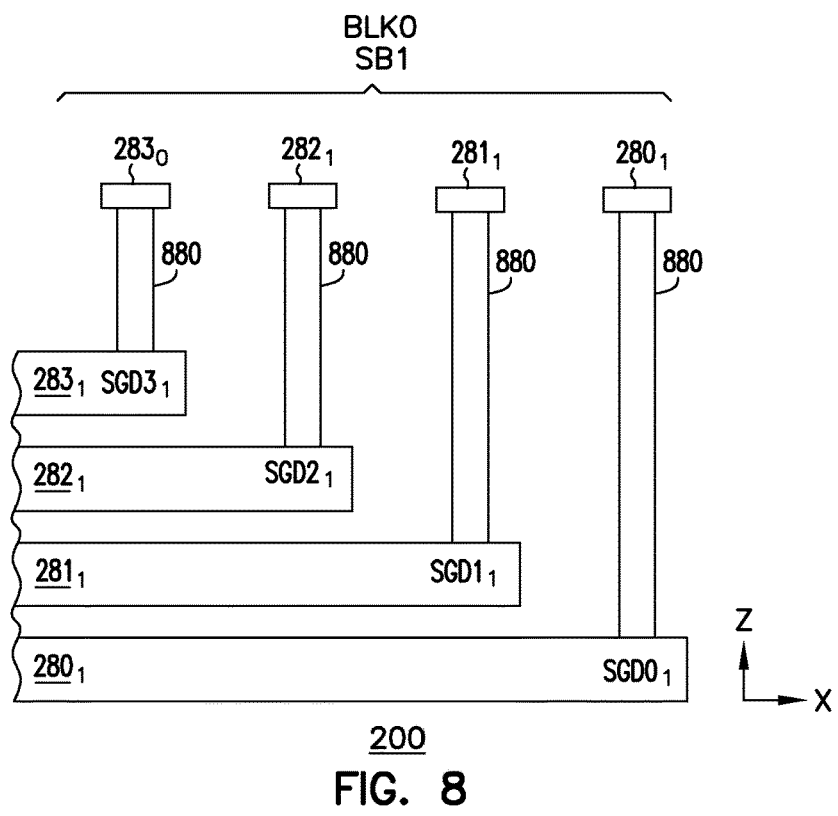
FIG. 8 shows a side view of drain select lines of another sub-block of the block of the memory device of FIG. 6, according to some embodiments described herein.

FIG. 6 shows a top view of a structure of the portion of memory device 200 including the portion shown in FIG. 5, according to some embodiments described herein. FIG. 7 shows a side view of the drain select lines (associated with signals $SGD0_0$, $SGD1_0$, $SGD2_0$, and $SGD3_0$) of sub-block SB0 of block BLK0 taken along line 7-7 of FIG. 6. FIG. 8 shows a side view of the drain select lines (associated with signals $SGD0_1$, $SGD1_1$, $SGD2_1$, and $SGD3_1$) of sub-block SB1 of block BLK0 taken along line 8-8 of FIG. 6. Sub-blocks SB0 and SB1 of block BLK1 (not shown in FIG. 7 and FIG. 8) can have similar structures as sub-blocks SB0 and SB1 of block BLK0. For simplicity, other elements (e.g., access lines $220_0$, $221_0$, $222_0$, $223_0$, $220_1$, $221_1$, $222_1$, and $223_1$ and source select lines (284, 285, and 286) of memory device 200 are not shown in FIG. 6, FIG. 7, and FIG. 8.

FIG. 6, FIG. 7, and FIG. 8 show example structures and routing paths of connections $280'_0$ (in block BLB0), $280'_1$ (in block BLB1), $281'_0$, $282'_0$, $283'_0$, $281'_1$, $282'_1$, and $283'_1$ (between blocks BLK0 and BLK1) of memory device 200. However, in an alternative structure of memory device 200, the structures and routing paths of connections $280'_0$, $281'_0$, $282'_0$, $283'_0$, $280'_1$, $281'_1$, $282'_1$, and $283'_1$ can be different from those shown in FIG. 6, FIG. 7, and FIG. 8.

The following description refers to FIG. 6, FIG. 7, and FIG. 8. As shown in FIG. 6, each of data lines 270, 271, and 272 can have a length extending in the direction of the y-direction, which is perpendicular to the x-direction. FIG. 6 also shows relative locations (at dashed-circles) of some of the pillars (e.g., pillars 541, 542, 543, and 544) located underneath and contacting conductive regions of respective data lines 270, 271, and 272 of memory device 200.

Each of select lines $280_0$, $281_0$, $282_0$, $283_0$, $280_1$, $281_1$, $282_1$, and $283_1$ can have length extending in the x-direction. Each of connections $280'_0$, $281'_0$, $282'_0$, $283'_0$, $280'_1$, $281'_1$, $282'_1$, and $283'_1$ can have a length extending in the y-direction and forms electrical contacts to respective drain select lines (e.g., underneath the connections). As shown in FIG. 7 and FIG. 8, connections $280'_0$, $281'_0$, $282'_0$, $283'_0$, $280'_1$, $281'_1$, $282'_1$, and $283'_1$ can have contacts (e.g., vertical conductive contacts in the z-direction) 780 and 880 contacting respective select lines $280_0$, $281_0$, $282_0$, $283_0$, $280_1$, $281_1$, $282_1$, and $283_1$.

FIG. 6, FIG. 7, and FIG. 8 show example structures (e.g., a staircase structure at edges) of select lines (e.g., drain select lines $280_0$, $281_0$, $282_0$, $283_0$, $280_1$, $281_1$, $282_1$, and $283_1$). However, in an alternative structure of memory device 200, the drain select lines of memory device 200 may have other structures as long as connections (e.g., connections similar to connections $280'_0$, $281'_0$, $282'_0$, $283'_0$, $280'_1$, $281'_1$, $282'_1$, and $283'_1$) can be formed to provide electrical contacts between the drain select lines (like the electrical contacts provided by connections $280'_0$, $281'_0$, $282'_0$, $283'_0$, $280'_1$, $281'_1$, $282'_1$, and $283'_1$ shown in FIG. 6, FIG. 7, and FIG. 8). As described above with reference to FIG. 2 through FIG. 8 connections $280'_0$, $281'_0$, $282'_0$, $283'_0$, $280'_1$, $281'_1$, $282'_1$, and $283'_1$ allow memory device 200 to have shared drain select lines.

Memory device 200 described above with reference to FIG. 2 through FIG. 8 can have improvements over some conventional memory devices. For example, some conventional memory devices (e.g., 3D NAND memory devices) have structures that include separate drain select lines, such as separate drain select lines between sub-blocks of the same blocks, separate drain select lines between different blocks, or separate drain select lines between sub-blocks of the same blocks and between sub-blocks of different blocks. Such structures in the conventional memory devices may include a relatively large number of components (e.g., drivers) to provide signals (e.g., drain select line signals) to respective drain select lines. Such a large number of components may occupy a relatively large area in the memory device. Therefore, device areas in some of the conventional memory devices can be limited by components that provide signals to the drain select lines of the memory device. Further, if the number of memory cell blocks increases to provide a higher memory density in a conventional memory device, the number of corresponding drain select lines in such conventional memory device also increases. Thus, device area for components that provide signals to the increased number of drain select lines can be even larger, thereby imposing more challenges to form such a conventional memory device for a given device area.

In memory device 200, as described above with reference to FIG. 2 through FIG. 8, some of the select lines (e.g., drain select lines $280_0$, $281_0$, $282_0$, $283_0$, $280_1$, $281_1$, $282_1$, and $283_1$) within the same block (e.g., blocks BLK0 or BLK1) or between different blocks can be electrically connected to each other. This allows memory device 200 to have shared select lines (e.g., shared drain select lines). Thus, fewer number of components (e.g., drivers 580 through 586 in FIG. 6) can be used to provide signals (e.g., $SGD0_0$, $SGD1_0$, $SGD2_0$, $SGD3_0$, $SGD0_1$, $SGD1_1$, $SGD2_1$, and $SGD3_1$ in FIG. 2 through FIG. 8) to the select lines of memory device 200. Therefore, in comparison with some conventional memory devices, the number of drivers (e.g., drivers 580 through 586 in FIG. 6) of memory device 200 can be smaller. This allows memory device 200 to have improvements (e.g., reduced drain select line drivers and smaller device area (e.g., die size) for a given memory storage density) over some conventional memory devices. As an example, memory device 200 may have 50% fewer drivers in comparison with some conventional memory devices because two sub-blocks of different blocks can share the same drain select line signals and drivers.

The description above with reference to FIG. 2 through FIG. 8 shows memory device 200 including two sub-blocks (e.g., SB0 and SB1) in a block (e.g., BLK0 or BLK1) as an example. However, memory device 200 can have more than two sub-blocks in each block.

Figure 9:
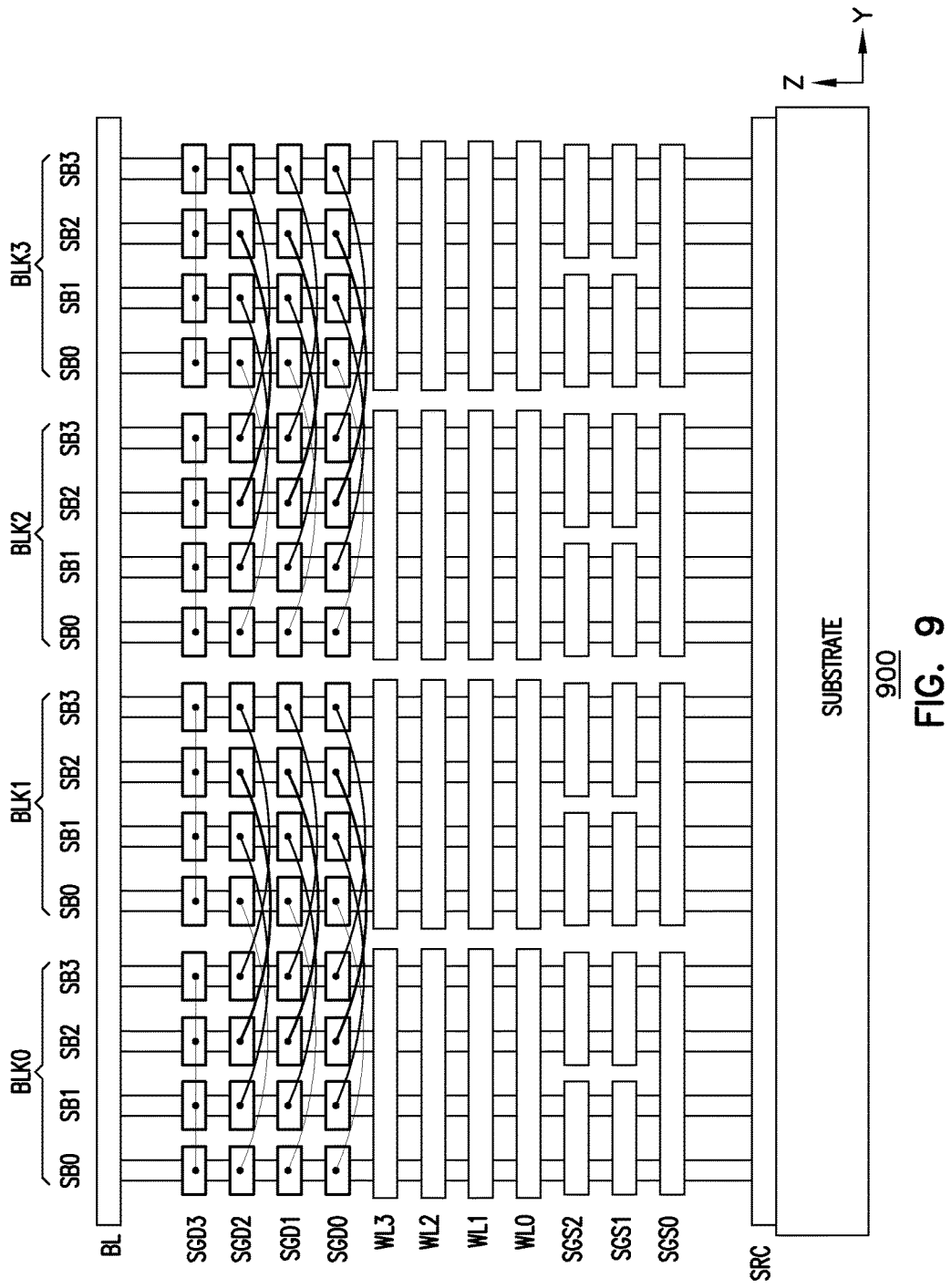
FIG. 9 shows a structure of a portion of a memory device including four sub-blocks in each block and a shared drain select line signal between two neighboring blocks, according to some embodiments described herein.

FIG. 9 shows a structure of a portion of memory device 900 including four sub-blocks in each block and shared drain select line signals between two neighboring blocks, according to some embodiments described herein. For simplicity, FIG. 9 omits detailed structures and reference labels for the elements of memory device 900. However, like memory device 200 (FIG. 2 through FIG. 8), memory device 900 can include at least the following elements: a substrate; a source (e.g., source line or lines) associated with signal SRC; data lines (signal BL in FIG. 9 can be similar to one of signals BL0, BL1, and BL2 on respective data lines 270, 271, and 272 of memory device 200); pillars extending vertically in the z-direction between the source and respective data lines; memory cell strings and access lines located along respective pillars; structures (e.g., structure 530 in FIG. 3) adjacent respective pillars and having a length extending in the direction of the length of the pillars; drain select lines; source select lines; driver circuitry to provide signals (e.g., drain and source select line signals) to respective drain select lines and source select lines; and other elements of a memory device such as memory device 100 of FIG. 1.

As shown in FIG. 9, memory device 900 can include blocks BLK0, BLK1, BLK2, and BLK3 and four sub-blocks SB0, SB1, SB2, and SB3 in each block. FIG. 9 shows memory device 900 having four blocks BLK0, BLK1, BLK2, and BLK3 and four sub-blocks SB0, SB1, SB2, and SB3 in each block as an example. However, the number of blocks and the number of sub-blocks in each of the blocks of memory device 900 can vary.

As shown in FIG. 9, each of blocks BLK0, BLK1, BLK2, and BLK3 can include its own access lines associated with signals (e.g., word line signals) WL0, WL1, WL2, and WL3. Access lines of blocks BLK0, BLK1, BLK2, and BLK3 are electrically separated from each other. For simplicity, FIG. 9 omits index numbers (e.g., 0, 1, 2, and 3) for signals WL0, WL1, WL2, and WL3 of respective blocks.

Each of blocks BLK0, BLK1, BLK2, and BLK3 can include respective source select lines as associated with signals (e.g., source select line signals) SGS0, SGS1, and SGS2. For simplicity, FIG. 9 omits index numbers (e.g., 0, 1, and 2) for signals SGS0, SGS1, and SGS2 of respective blocks.

As shown in FIG. 9, each of sub-blocks SB0, SB1, SB2, and SB3 of each of blocks BLK0, BLK1, BLK2, and BLK3 can include four drain select lines associated with four signals (e.g., drain select line signals) SGD0, SGD1, SGD2, and SGD3. For simplicity, FIG. 9 omits index numbers (e.g., 0, 1, 2, and 3) for signals SGD0, SGD1, SGD2, and SGD3 of respective sub-blocks.

FIG. 9 also shows connections (not labeled, but can be similar to connections $283'_0$ and $282'_1$ of FIG. 6) electrically connected to the top four drain select lines of the same block, such that that the top four drain select lines of sub-blocks SB0, SB1, SB2, and SB3 of the same block can share (can be provided with) the same signal (e.g., signal SGD3).

FIG. 9 also shows connections (not labeled, but can be similar to connections $280'_0$, $281'_0$, and $282'_0$, and connections $280'_1$, $280'_1$ and $282'_1$ of FIG. 6)) electrically connected drain select lines (associated with signals SGD0, SGD1, SGD2, and SGD3) of respective sub-blocks SB0, SB1, SB2, and SB3 of two neighboring blocks among BLK0, BLK1, BLK2, and BLK3 of memory device 900. Like memory device 200 (FIG. 2 through FIG. 8), two neighboring blocks (e.g., BLK0 and BLK1; or BLK2 and BLK3) of memory device 900 of FIG. 9 can share the same drain select line signals. For example, blocks BLK0 and BLK1 can share signals SGD0, SGD1, and SGD2. Blocks BLK2 and BLK3 can share signals SGD0, SGD1, and SGD2. Signals SGD0, SGD1, and SGD2 shared by blocks BLK0 and BLK1 are different from signals SGD0, SGD1, and SGD2 shared by blocks BLK2 and BLK3. This allows memory device 900 to have shared drain select lines between neighboring blocks. Thus, two neighboring blocks (e.g., BLK0 and BLK1; or BLK2 and BLK3) of memory device 900 can share the components (not shown, but can be similar to drivers 580 through 586 of FIG. 6) that provide (e.g., drive) signals SGD0, SGD1, SGD2, and SGD3. In comparison with some conventional memory devices, memory device 900 can have improvements similar to those of memory device 200 (FIG. 2 through FIG. 8).

In the above description with reference to FIG. 2 through FIG. 9, memory devices 200 and 900 include an example of two neighboring blocks that have connections (e.g., $281'_0$, $282'_0$, $283'_0$, $281'_1$, $282'_1$, and $283'_1$ in FIG. 6 and connections (not labeled) in FIG. 9) to allow some drain select lines of such two neighboring blocks to be shared. However, the blocks that have such connections (e.g., $281'_0$, $282'_0$, $283'_0$, $281'_1$, $282'_1$, and $283'_1$ in FIG. 6 and connections (not labeled) in FIG. 9) may be two non-neighboring blocks. Non-neighboring blocks are blocks not located immediately (e.g., adjacent) next to each other. For example, in FIG. 9, non-neighboring blocks of memory device 900 can include blocks BLK0 and BLK2, blocks BLK0 and BLK3, and blocks BLK1 and BLK3.

Moreover, in the above description with reference to FIG. 2 through FIG. 9, memory devices 200 and 900 include an example of two neighboring blocks that have connections (e.g., $281'_0$, $282'_0$, $283'_0$, $281'_1$, $282'_1$, and $283'_1$ in FIG. 6 and connections (not labeled) in FIG. 9) to allow some drain select lines of two such neighboring blocks to be shared. However, memory devices 200 and 900 can have such connections connected between at least three (three or more) neighboring blocks, or a combination of at least three of neighboring and non-neighboring blocks. Such structures (e.g., at least three blocks having shared drain select lines) can result in a higher reduction in the number of drivers (to provide the shared drain select line signals) and a smaller area used for the drivers in comparison with the structure where two blocks have shared drain select lines.

Figure 10:
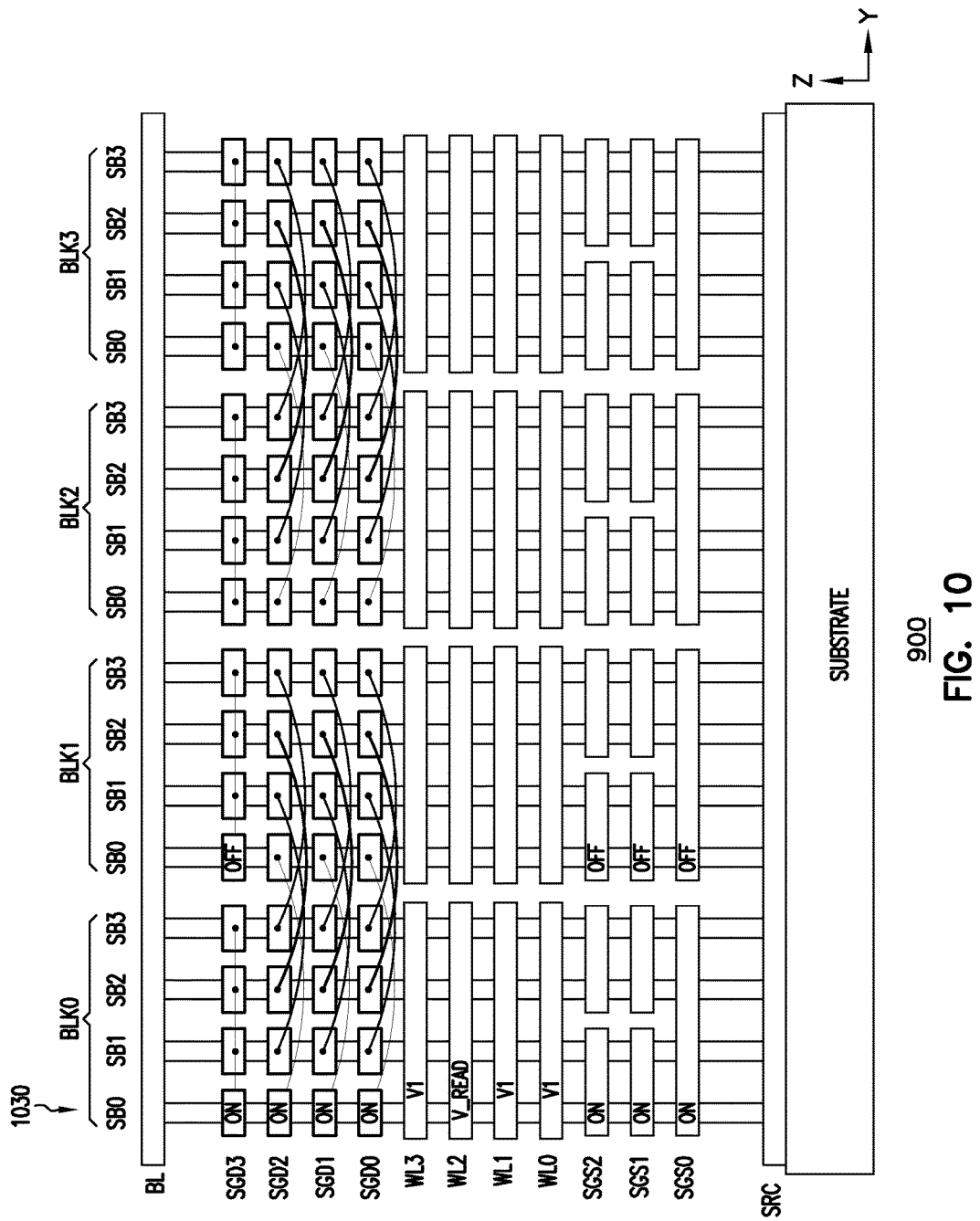
FIG. 10 shows the structure the memory device of FIG. 9 including an example read operation, according to some embodiments described herein.

FIG. 10 shows the structure memory device 900 of FIG. 9 including an example read operation, according to some embodiments described herein. The read operation is performed to read (e.g., sense) information (e.g., previously stored information, such as user data) from a selected memory cell among memory cells of a selected memory cell string of a selected sub-block.

The read operation associated with FIG. 10 can also be performed by memory device 900 during part of another operation (different from the read operation). For example, the read operation associated with FIG. 10 can also be performed as a program verify stage of a write (e.g., program) operation to verify whether information stored (e.g., stored during a program stage of a write operation) in a selected memory cell reaches a target value (e.g., target programmed state).

In another example, the read operation associated with FIG. 10 can also be performed during an erase verify stage of an erase operation to verify whether a selected memory cell reaches a target erased value (e.g., a target erase state).

In FIG. 10 (also FIG. 11 and FIG. 12), the select gate having the label "ON" is the select gate being turned on by memory device 900 during a particular operation, and the select gate having the label "OFF" is the select gate being turned off by memory device 900 during a particular operation. As described above, a voltage can be provided to a signal associated with a select line in order to turn on or turn off a select gate controlled by the select line.

In FIG. 10 (also FIG. 11 and FIG. 12), the select gates without labels "ON" or "OFF" can be turned off by memory device 900. However, some particular select gates without the label "ON" or "OFF" in unselected sub-blocks may be turned on because such particular select gates may share a select line (or select lines) with a selected sub-block. However, such particular turned-on select gates may have no impact or insignificant impact on the operation being performed on the selected sub-block because other select gates (e.g., select gates located along the same pillars with the particular turned-on select gates) of the unselected blocks are turned off by memory device 900.

The example of FIG. 10 shows a selected sub-block 1030, which can be sub-block SB0 of block BLK0. As shown in FIG. 10, memory device 900 can turn on the drain select gates (associated with signals SGD0, SGD1, SGD2, and SGD3) and the source select gates (associated with signals SGS0, SGS1, and SGS2) of selected sub-block 1030 (e.g., sub-block SB0 of block BLK0). This allows a selected memory cell of a selected memory cell string of selected sub-block 1030 to be read (e.g., sensed). The values of voltages provided to the signals associated with the drain and source select lines and access lines (e.g., word lines) of memory device 900 during a read operation can be similar to the values of voltages used in a read operation of a memory device such as a 3D NAND memory device.

In the example shown in FIG. 10, a selected memory cell is assumed to be the memory cell of selected sub-block 1030 adjacent the access line (e.g., word line) associated with signal WL2. Based on this example, signals WL0, WL1, WL2, and WL3 can be provide with voltages V1, V_READ, V1, and V1, respectively. Voltage V1 and V_READ have different values. Voltages V1 and V_READ can have values known to those skilled in the art.

As shown in FIG. 10, the drain select lines (associated with signals SGD0, SGD1, and SGD2) of sub-block SB0 (e.g., selected sub-block) of block BLK0 are in electrical contact with respective drain select lines (associated with signals SGD0, SGD1, and SGD2) of sub-block SB0 (unselected sub-block) of block BLK1 through respective connections (not labeled) in FIG. 10, which are similar to connections $280'_0$, $281'_0$, $282'_0$ of FIG. 6). Thus, in the example read operation associated with FIG. 10 performed on sub-block SB0 (selected sub-block) of block BLK0, the drain select lines (associated with signals SGD0, SGD1, and SGD2) of sub-block SB0 (unselected sub-block) of block BLK1 can also be provided with (e.g., applied) the same signals (e.g., SGD0, SGD1, and SGD2). However, conduction of current in the unselected block (e.g., conduction of current between data line associated with signal BL and source associated with signal SRC) will not occur because the source select lines associated with signals SGS0, SGS1, SGS2 of sub-block SB0 (unselected sub-block) of block BLK1 are turned off (shown as "OFF" in FIG. 10). Thus, no accidental selection can occur (because no conduction of current occurs) in the unselected sub-block that shares the select lines (e.g., associated with signals SGD0, SGD1, and SGD2) with the selected sub-block. Further, as shown in FIG. 10, the drain select line associated with signal SGD3 of sub-block SB0 (unselected sub-block) of block BLK1 can be turned off. This further prevents accidental selection that may be caused by the unselected sub-block.

Therefore, in FIG. 10, the read operation performed on a selected sub-block associated with FIG. 10 can remain a proper read operation because current conduction can occur (e.g., occur only) in the selected sub-block (e.g., sub-block SB0 of block BLK0) and not in the unselected sub-block although the unselected sub-block shares select lines (e.g., controlled by signals SGD0, SGD1, and SGD2) with the selected sub-block.

The read operation described above is performed on memory cells of memory device 900. However, the read operation described above can also be performed on select gates (e.g., controlled by signals SGD0, SGD1, SGD2, SGD3, SGS0, SGS1, and SGS2) of memory device 900. For example, in a structure of memory device 900, the select gates and the memory cells can have the same structure (e.g., which can include structure 530 shown in FIG. 5). In such a structure of memory device 900, each of the select gates (e.g., controlled by signals SGD0, SGD1, SGD2, SGD3, SGS0, SGS1, and SGS2) can be set (e.g., programmed) to have a target threshold voltage (e.g., Vt), such that each the select gates can operate like a transistor.

The read operation described above can be performed on a selected select gate of memory device 900 to determine the value of the threshold voltage of the selected select gate similar to determining the value of information in a selected memory cell. For example, the read operation described above can be performed on a selected select gate to determine the threshold voltage value of the selected select gate during a read operation performed on the selected select gate. In another example, the read operation described above can be performed on a selected select gate to determine whether the threshold voltage value of the selected select gate reaches a target threshold voltage during a program verify stage of a write operation performed on the selected select gate. In another example, the read operation described above can be performed on a selected select gate to determine whether a selected select gate reaches a target erased threshold voltage value.

Figure 11:
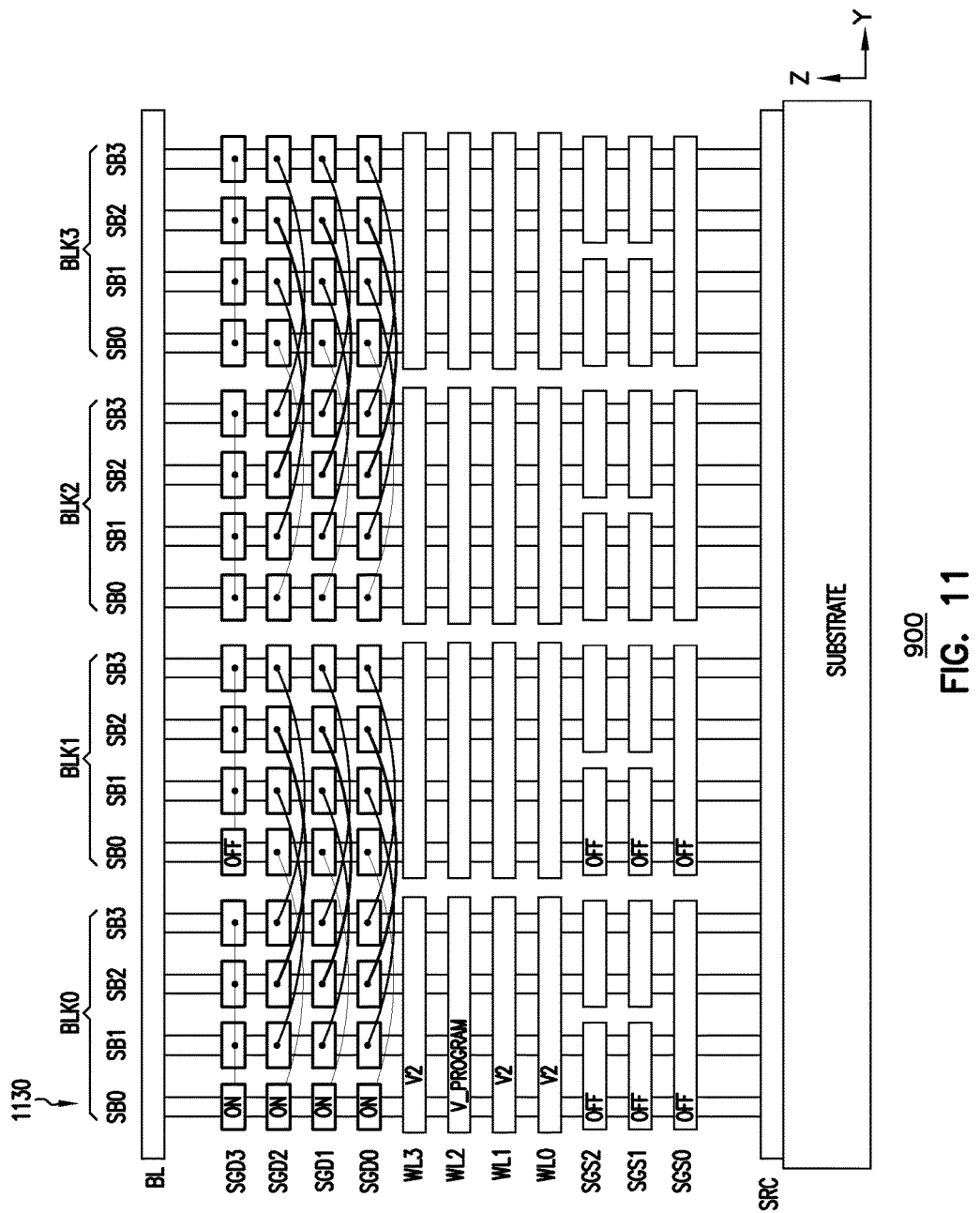
FIG. 11 shows the structure the memory device of FIG. 9 including an example write operation, according to some embodiments described herein.

FIG. 11 shows the structure memory device 900 of FIG. 9 including an example write operation (e.g., program operation), according to some embodiments described herein. The write operation is performed to store (e.g., program) information (e.g., user data) in a selected memory cell among memory cells of a selected memory cell string of a selected sub-block.

The example of FIG. 11 shows a selected sub-block 1130, which can be sub-block SB0 of block BLK0. As shown in FIG. 11, memory device 900 can turn on the drain select gates (associated with signals SGD0, SGD1, SGD2, and SGD3) and turn off the source select gates (associated with signals SGS0, SGS1, and SGS2) of selected sub-block 1130 (e.g., sub-block SB0 of block BLK0). This allows information to be stored in a selected memory cell of a selected memory cell string of selected sub-block 1130. The values of voltages provided to the signals associated with drain and source select lines and access lines (e.g., word lines) of memory device 900 during a write operation can be similar to the values of voltages used in a write operation of a 3D NAND memory device.

In the example shown in FIG. 11, a selected memory cell is assumed to be the memory cell of selected sub-block 1130 adjacent the access line (e.g., word line) associated with signal WL2. Based on this example, signals WL0, WL1, WL2, and WL3 can be provided with voltages V2, V_PROGRAM, V2, and V2, respectively. Voltage V2 and V_PROGRAM have different values. Voltages V2 and PROGRAM can have values known to those skilled in the art.

As shown in FIG. 11, the drain select lines (associated with signals SGD0, SGD1, and SGD2) of sub-block SB0 (e.g., selected sub-block) of block BLK0 are in electrical contact with respective drain select lines (associated with signals SGD0, SGD1, and SGD2) of sub-block SB0 (unselected sub-block) of block BLK1 through respective connections (not labeled) in FIG. 11, which are similar to connections $280'_1$, $281'_1$, $282'_1$ of FIG. 6). Thus, in the example write operation associated with FIG. 11 performed on sub-block SB0 (selected sub-block) of block BLK0, the drain select lines (associated with signals SGD0, SGD1, and SGD2) of sub-block SB0 (unselected sub-block) of block BLK1 can also be provided with (e.g., applied to) the same signals (e.g., SGD0, SGD1, and SGD2). However, storing information in sub-block SB0 (selected sub-block) of block BLK0 may not cause program disturb to sub-block SB0 (unselected sub-block) of block BLK1 because (like a write operation of a memory device such as a 3D NAND memory device) the access lines (e.g., word lines associated with signals WL0, WL1, WL2, and WL3) associated with sub-block SB0 (unselected sub-block) of block BLK1 are not provided with the same voltages (e.g., high voltages) provided to access lines (e.g., word lines associated with signals WL0, WL1, WL2, and WL3) associated with sub-block SB0 (selected sub-block) of block BLK0. Further, no interference from sub-block SB0 (unselected sub-block) of block BLK1 may occur because the drain select line associated with signal SGD3 of sub-block SB0 (unselected sub-block) of block BLK1 and the source select lines associated with signals SGD0, SGS1, SGS2 of sub-block SB0 of block BLK1 can be turned off (shown as "OFF" in FIG. 11). Therefore, in FIG. 11, the write operation performed on a selected sub-block can remain a proper write although the unselected sub-block shares select lines (e.g., associated with signals SGD0, SGD1, and SGD2) with the selected sub-block.

The write operation described above is performed on memory cells of memory device 900. However, the write operation described above can also be performed on select gates (e.g., associated with signals SGD0, SGD1, SGD2, SGD3, SGS0, SGS1, and SGS2) of memory device 900. For example, in a structure of memory device 900, the select gates and the memory cells can have the same structure (e.g., which can include structure 530 shown in FIG. 5). In such a structure of memory device 900, each of the select gates (e.g., associated with signals SGD0, SGD1, SGD2, SGD3, SGS0, SGS1, and SGS2) can be set (e.g., programmed) to have a target threshold voltage (e.g., Vt), such that each of the select gates can operate like a transistor. The write operation described above can be performed on a selected select gate of memory device 900 to set the value of the threshold voltage of the selected select gate similar to storing information in a selected memory cell.

Figure 12:
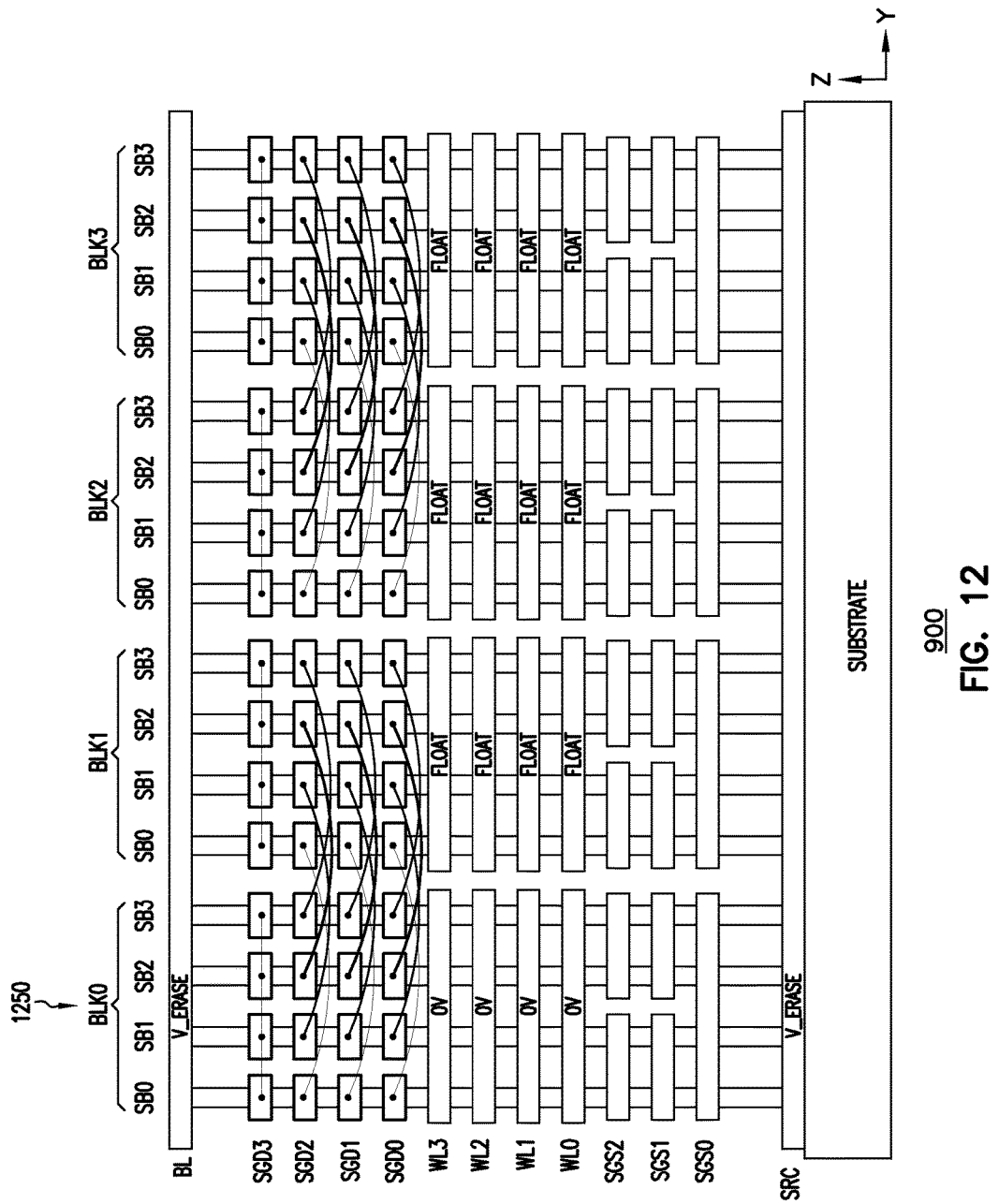
FIG. 12 shows the structure the memory device of FIG. 9 including an example erase operation, according to some embodiments described herein.

FIG. 12 shows the structure memory device 900 of FIG. 9 including an example erase operation, according to some embodiments described herein. The erase operation is performed to erase information (e.g., user data) from memory cells of a portion (e.g., a selected block) memory device 900.

The example of FIG. 12 shows a selected block 1250 (which can be block BLK0). In the erase operation of memory device 900, voltages provided (e.g., applied) to the drain and source select gates (e.g., associated with respective signals SGD0, SGD1, SGD2, SGD3, SGS0, SGS1, and SGS2) of selected and unselected blocks can be similar to those already known to skilled in the art (e.g., similar to the voltages applied to the drain and source select lines of a memory device such as a 3D NAND memory device).

In the example shown in FIG. 12 where block 1250 (e.g., block BLK0) is a selected block, the access lines (associated with signals WL0, WL1, WL2, and WL3) of block BLK0 (selected block) can be provided with zero volts (0V), and the access lines (associated with signals WL0, WL1, WL2, and WL3) of blocks BLK1, BLK2, and BLK3 (unselected blocks) can be place in a float condition ("FLOAT"). In the float condition, the access lines of blocks BLK1, BLK2, and BLK3 are not electrically connected to nodes that have fixed voltages. Thus, the voltages on access lines of blocks BLK1, BLK2, and BLK3 can vary (e.g., increase) in the same direction as a voltage V_ERASE applied to each of the data lines (e.g., bit line) associated with signal BL and the source (e.g., source line) associated with signal SRC. Voltage V_ERASE can have a value known to those skilled in the art (e.g., similar to an erase voltage used in a memory device such as a 3D NAND memory device).

In the erase operation associated with FIG. 12, the potential of the bodies of the memory cell strings (e.g., part of the respective pillars adjacent the memory cell strings) of block BLK0 (selected block) will increase up to the value of voltage V_ERASE (an erase voltage) by, for example, the action of gate-induced drain-leakage (GIDL) current injection. With the condition in FIG. 12, information from memory cells of block BLK0 (selected block) are erased. New information can be store in the memory cells of block BLK0 in a write operation performed after the erase operation.

In the erase operation associated with FIG. 12, the potential of the bodies of the memory cell strings (e.g., part of the respective pillars adjacent the memory cell strings) of blocks BLK1, BLK2, and BLK3 (unselected blocks) will also increase up to the value of voltage V_ERASE (an erase voltage) by GIDL, for example. However, information from memory cells of blocks BLK1, BLK2, and BLK3 will remain unchanged (will not erased) because of the float condition present in the access lines of blocks BLK1, BLK2, and BLK3. In an alternative erase operation of memory device 900, instead of placing the access lines of blocks BLK1, BLK2, and BLK3 (unselected blocks) in a float condition, a voltage (e.g., an erase inhibit voltage from a note) can be applied to each the access lines of blocks BLK1, BLK2, and BLK3, such that information from memory cells of blocks BLK1, BLK2, and BLK3 can remain unchanged.

The erase operation described above is performed on memory cells of memory device 900. However, erase operation described above can also be performed on select gates (e.g., associated with signals SGD0, SGD1, SGD2, SGD3, SGS0, SGS1, and SGS2) of memory device 900. For example, in a structure of memory device 900, the select gates and the memory cells can have the same structure (e.g., which can be the same as structure 530 shown in FIG. 5). In such a structure of memory device 900, each of the select gates (e.g., associated with signals SGD0, SGD1, SGD2, SGD3, SGS0, SGS1, and SGS2) may have a threshold voltage, which can be either an intrinsic (non-programmed) threshold voltage or a programmed threshold voltage. The erase operation described above can be performed on a selected block (or selected blocks) of memory device 900 to erase the threshold voltages of memory cells of the select gate of the selected block (or selected blocks). New (e.g., target) threshold voltages can be set (e.g., programmed) in the select gates of a selected block after the erase operation.

The illustrations of apparatuses (e.g., memory devices 100, 200, and 900) and methods (e.g., operating methods associated with memory devices 100, 200, and 900) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, and 900) or a system (e.g., a computer, a cellular phone, or other electronic system) that includes a device such as any of memory devices 100, 200, and 900.

Any of the components described above with reference to FIG. 1 through FIG. 9 can be implemented in a number of ways, including simulation via software. Thus, apparatuses (e.g., memory devices 100, 200, and 900 or part of each of these memory devices, including a control unit in these memory devices, such as control unit 118 (FIG. 1)) described above may all be characterized as "modules" (or "module") herein. Such modules may include hardware circuitry, single- and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices 100, 200, and 900 may be included in apparatuses (e.g., electronic circuitry) such as high-speed computers, communication and signal processing circuitry, single- or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 9 include apparatuses and methods of forming and operating the apparatuses. Some of the apparatuses include a data line, a first memory cell string including first memory cells located in different levels of the apparatus, first access lines to access the first memory cells, a first select gate coupled between the data line and the first memory cell string, a first select line to control the first select gate, a second memory cell string including second memory cells located in different levels of the apparatus, second access lines to access the second memory cells, the second access lines being electrically separated from the first access lines, a second select gate coupled between the data line and the second memory cell string, a second select line to control the second select gate, and the first select line being in electrical contact with the second select lines. Other embodiments including additional apparatuses and methods are described.

In the detailed description and the claims, a list of items joined by the term "one of" can mean any of the listed items. For example, if items A and B are listed, then the phrase "one of A and B" means A only or B only. In another example, if items A, B, and C are listed, then the phrase "one of A, B, and C" means A only; B only; or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only; B only; or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

In the detailed description and the claims, a list of items joined by the term "one of" can mean only one of the list items. For example, if items A and B are listed, then the phrase "one of A and B" means A only (excluding B), or B only (excluding A). In another example, if items A, B, and C are listed, then the phrase "one of A, B, and C" means A only; B only; or C only. Item A can include a single element or multiple elements. Item B can include a single element or multiple elements. Item C can include a single element or multiple elements.

The above description and the drawings illustrate some embodiments of the inventive subject matter to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a data line;
   a first memory cell string including first memory cells located in different levels of the apparatus;
   first access lines to access the first memory cells;
   a first select gate coupled between the data line and the first memory cell string;
   a first select line to control the first select gate;
   a second memory cell string including second memory cells located in different levels of the apparatus;
   second access lines to access the second memory cells, the second access lines being electrically separated from the first access lines;
   a second select gate coupled between the data line and the second memory cell string; and
   a second select line to control the second select gate, wherein the first select line is in electrical contact with the second select line;
   a third select gate coupled in series with the first select gate between the data line and the first memory cell string;
   a third select line to control the third select gate;
   a fourth select gate coupled in series with the second select gate between the data line and the second memory cell string; and
   a fourth select line to control the fourth select gate, wherein the third select line is in electrical contact with the fourth select line;
   a fifth select gate coupled in series with the first and third select gates between the data line and the first memory cell string;
   a fifth select line to control the fifth select gate;
   a sixth select gate coupled in series with the second and fourth select gates between the data line and the second memory cell string; and
   a sixth select line to control the sixth select gate, wherein the fifth select line is in electrical contact with the sixth select line.

2. The apparatus of claim 1, further comprising:
   a first additional memory cell string including first additional memory cells, the first additional memory cells sharing the first access lines with the first memory cells;
   a first additional select gate coupled between the data line and the first additional memory cell string;
   a first additional select line to control the first additional select gate;
   a second additional memory cell string including second additional memory cells, the second additional memory cells sharing the second access lines with the second memory cells;
   a second additional select gate coupled between the data line and the second additional memory cell string; and
   a second additional select line to control the second additional select gate, wherein the first additional select line is in electrical contact with the second additional select line.

3. An apparatus comprising:
   a data line;
   a first memory cell string including first memory cells located in different levels of the apparatus;
   first access lines to access the first memory cells;
   a first select gate coupled between the data line and the first memory cell string;
   a first select line to control the first select gate;
   a second memory cell string including second memory cells located in different levels of the apparatus;
   second access lines to access the second memory cells, the second access lines being electrically separated from the first access lines;
   a second select gate coupled between the data line and the second memory cell string;
   a second select line to control the second select gate, wherein the first select line is in electrical contact with the second select line;
   a first additional select gate coupled in series with the first select gate between the data line and the first memory cell string;
   a third memory cell string including third memory cells, the third memory cells sharing the first access lines with the first memory cells;
   a third select gate coupled between the data line and the third memory cell string; and
   a third select line to control the third select gate, wherein the first additional select line is in electrical contact with the third select line.

4. The apparatus of claim 1, further comprising:
   a first additional select gate coupled to the first memory cell string, the first memory cell string being between the first select gate and the first additional select gate; and a first additional select line to control the first additional select gate, wherein the first select line is electrically separated from the first additional select line.

5. The apparatus of claim 3, further comprising:
a first transistor; and
a second transistor coupled to the first transistor, the first and second transistors coupled to the first and second select lines.

6. The apparatus of claim 5, wherein the first and second transistors have different transistor types.

7. The apparatus of claim 5, wherein the first and second transistors have the same transistor types.

8. The apparatus of claim 1, further comprising:
a first driver including a first output node coupled to the first and second select lines;
a second driver including a second output node coupled to the third and fourth select lines; and
a third driver including a third output node coupled to fifth and sixth select lines.

9. An apparatus comprising:
a conductive material;
a first pillar contacting the conductive material;
a second pillar contacting the conductive material;
first memory cells located along the first pillar and between the conductive material and a substrate, and a first group of conductive materials adjacent the first memory cells;
second memory cells located along the second pillar between the conductive material and a substrate, and a second group of conductive materials adjacent the second memory cells, the second group of conductive materials being electrically separated from the first group of conductive materials;
a first conductive material located along the first pillar between the first memory cells and the conductive material;
a second conductive material located along the first pillar between the first conductive material and conductive material;
a first additional conductive material located along the second pillar between the second memory cells and the conductive material;
a second additional conductive material located along the second pillar between the second additional conductive material and conductive material;
a third conductive material contacting the first conductive material and the first additional conductive material
a first additional pillar contacting the conductive material;
a second additional pillar contacting the conductive material;
first additional memory cells located along the first additional pillar, the first group of conductive materials being adjacent the first additional memory cells;
second additional memory cells located along the second pillar, the second group of conductive materials being adjacent the second additional memory cells,
a third conductive material located along the first additional pillar between the first additional memory cells and the conductive material;
a fourth conductive material located along the first additional pillar between the third conductive material and conductive material;
a fifth conductive material located along the second additional pillar between the second additional memory cells and the conductive material;
a sixth additional conductive material located along the second additional pillar between the fifth additional conductive material and conductive material forming the part of the data line; and
an additional conductive material contacting the third conductive material and the fifth conductive material.

10. The apparatus of claim 9, wherein the first group of conductive materials are metal.

11. The apparatus of claim 9 wherein the first group of conductive materials are polysilicon.

12. The apparatus of claim 9 wherein the conductive material is part of a bit line of the memory device.

13. The apparatus of claim 9 wherein the first memory cell string and the first additional memory string are included in a first block, and the second memory cell string and the second additional memory string are included in second block.

14. The apparatus 13, wherein the first block is located immediately to the second block.

* * * * *